United States Patent
Nonomura et al.

(10) Patent No.: US 7,549,566 B2
(45) Date of Patent: Jun. 23, 2009

(54) METHOD, APPARATUS AND PROGRAM OF THERMAL ANALYSIS, HEAT CONTROLLER AND HEATING FURNACE USING THE METHOD

(75) Inventors: Masaru Nonomura, Chikushino (JP); Yoshinori Isobata, Kofu (JP); Hiroaki Onishi, Ibaraki (JP); Masahiro Taniguchi, Hirakata (JP)

(73) Assignee: Panasonic Corporation, Osaka (JP)

( * ) Notice: Subject to any disclaimer, the term of this patent is extended or adjusted under 35 U.S.C. 154(b) by 700 days.

(21) Appl. No.: 10/523,196

(22) PCT Filed: Jul. 30, 2003

(86) PCT No.: PCT/JP03/09648

§ 371 (c)(1),
(2), (4) Date: Mar. 16, 2005

(87) PCT Pub. No.: WO2004/011182

PCT Pub. Date: Feb. 5, 2004

(65) Prior Publication Data

US 2006/0006210 A1    Jan. 12, 2006

(30) Foreign Application Priority Data

Jul. 31, 2002  (JP) .......................... 2002-223536

(51) Int. Cl.
*B23K 31/02* (2006.01)

(52) U.S. Cl. .......................... 228/102; 228/103; 228/9; 219/494

(58) Field of Classification Search .................. 228/9, 228/102, 103; 219/494, 506, 388, 483
See application file for complete search history.

(56) References Cited

U.S. PATENT DOCUMENTS 4,775,776 A    10/1988    Rahn et al.

(Continued)

OTHER PUBLICATIONS

Morales S., et al., entitled "*A Pole-Placement Partial State Reference Model Adaptive Control of a Rapid Thermal Processor*", Proceedings of the International Conference on Systems, Man and Cybernetics. Le Touquet, Oct. 17-20, 1993, New York, IEEE, US, vol. 3, Oct. 17, 1993, pp. 19-24, XP010132092.

(Continued)

*Primary Examiner*—Jessica L Ward
*Assistant Examiner*—Michael Aboagye
(74) *Attorney, Agent, or Firm*—Wenderoth, Lind & Ponack, L.L.P.

(57) ABSTRACT

A heating characteristic value at any measuring point of an object at any measuring location of a heating furnace is determined as a single invariable by using temperature (Tint and Ts) measured at the measuring point of the object and heating temperature (Ta) and heating time (t) at the measuring location of the heating furnace. The heating characteristic value (m-value) may be calculated without using physical characteristics of the object. By using the m-value, a temperature profile of the object heated under a modified heating condition may be simulated in a short period of time without actually heating and measuring the temperature of the object at a high accuracy level. By using such a simulation, an appropriate heating condition for heating an object in accordance with a desired heating condition may easily be determined.

4 Claims, 17 Drawing Sheets

U.S. PATENT DOCUMENTS

| | | | |
|---|---|---|---|
| 4,927,068 A | | 5/1990 | Naka et al. |
| 5,003,160 A | * | 3/1991 | Matsuo et al. ............. 219/494 |
| 5,099,442 A | | 3/1992 | Furuta et al. |
| 5,561,612 A | * | 10/1996 | Thakur ....................... 700/300 |
| 6,206,265 B1 | | 3/2001 | Yamaoka |
| 6,283,379 B1 | | 9/2001 | Kazmierowicz et al. |
| 6,610,968 B1 | * | 8/2003 | Shajii et al. ................. 219/497 |
| 6,619,531 B1 | * | 9/2003 | Yamaoka ....................... 228/9 |

OTHER PUBLICATIONS

S. Morales et al., "*A Pole-Placement Partial State Reference Model Adaptive Control of a Rapid Thermal Processor*", Proceedings of the International Conference on Systems, Man and Cybernetics, Le Touquet, Oct. 17-20, 1993, New York, IEEE, US, vol. 3, pp. 19-24.

* cited by examiner

| Heating Sections | Reflow Stage | | Preheat Stage | | | | |
|---|---|---|---|---|---|---|---|
| | VII | VI | V | IV | III | II | I |
| Heating Temp. | 240 | 240 | 190 | 190 | 190 | 190 | 190 |

V=1.25m/minute (b)

| Heating Sections | Reflow Stage | | Preheat Stage | | | | |
|---|---|---|---|---|---|---|---|
| | VII | VI | V | IV | III | II | I |
| Heating Temp. | 240 | 277 | 190 | 190 | 190 | 259 | 259 |

V=1.25m/minute (c)

| Items | Simulation | | |
|---|---|---|---|
| | 3a | 3b | 3c |
| $\Delta T$ [°C] | 4.8 | | |
| Peak Temp. [°C] | 232.0 | 228.1 | 232.9 |
| Time[sec] over 220°C | 25.6 | 22.4 | 25.2 |
| Time[sec] over 200°C | 38.2 | 35.0 | 38.2 |

(d)

| Items | Verification | | |
|---|---|---|---|
| | 3a | 3b | 3c |
| $\Delta T$ [°C] | 6.3 | | |
| Peak Temp. [°C] | 231.7 | 225.7 | 232.0 |
| Time[sec] over 220°C | 28.0 | 20.8 | 25.0 |
| Time[sec] over 200°C | 39.4 | 34.8 | 38.0 |

(e)

| Items | Simulation − Verification | | |
|---|---|---|---|
| | 3a | 3b | 3c |
| $\Delta T$ [°C] | −1.5 | | |
| Peak Temp. [°C] | 0.3 | 2.4 | 0.9 |
| Time[sec] over 220°C | −2.4 | 1.6 | 0.2 |
| Time[sec] over 200°C | −1.2 | 0.2 | 0.2 |

| Heating Sections | Reflow Stage | | Preheat Stage | | | | |
|---|---|---|---|---|---|---|---|
| | VII | VI | V | IV | III | II | I |
| Heating Temp. | 240 | 240 | 190 | 190 | 190 | 190 | 190 |

V=0.8m/minute (b)

| Heating Sections | Reflow Stage | | Preheat Stage | | | | |
|---|---|---|---|---|---|---|---|
| | VII | VI | V | IV | III | II | I |
| Heating Temp. | 240 | 240 | 190 | 190 | 190 | 190 | 190 |

V=1.6m/minute (c)

| Items | Simulation | | |
|---|---|---|---|
| | 3a | 3b | 3c |
| $\Delta T$ [°C] | 10.7 | | |
| Peak Temp. [°C] | 213.3 | 202.6 | 210.8 |
| Time[sec] over 200°C | 20.6 | 5.7 | 15.2 |
| Time[sec] over 180°C | 37.6 | 26.9 | 33.3 |

(d)

| Items | Verification | | |
|---|---|---|---|
| | 3a | 3b | 3c |
| $\Delta T$ [°C] | 8.4 | | |
| Peak Temp. [°C] | 212.9 | 206.5 | 214.9 |
| Time[sec] over 200°C | 18.4 | 10.0 | 19.8 |
| Time[sec] over 180°C | 36.4 | 27.8 | 34.2 |

(e)

| Items | Simulation − Verification | | |
|---|---|---|---|
| | 3a | 3b | 3c |
| $\Delta T$ [°C] | 2.3 | | |
| Peak Temp. [°C] | 0.4 | −3.9 | −4.1 |
| Time[sec] over 200°C | 2.2 | −4.3 | −4.6 |
| Time[sec] over 180°C | 1.2 | −0.9 | −0.9 |

| Heating Sections | VII | VI | V | IV | III | II | I |
|---|---|---|---|---|---|---|---|
| Heating Temp. | 240 | 240 | 190 | 190 | 190 | 190 | 190 |

(b)

| Heating Sections | VII | VI | V | IV | III | II | I |
|---|---|---|---|---|---|---|---|
| Heating Temp. | 256 | 281 | 190 | 190 | 190 | 273 | 273 |

V=0.8m/minute (c)

| Items | Simulation | | |
|---|---|---|---|
| | 3a | 3b | 3c |
| ΔT [°C] | | 5.8 | |
| Peak Temp. [°C] | 236.0 | 231.0 | 236.8 |
| Time[sec] over 220°C | 25.7 | 22.0 | 25.6 |
| Time[sec] over 200°C | 39.0 | 34.7 | 37.9 |

(d)

| Items | Verification | | |
|---|---|---|---|
| | 3a | 3b | 3c |
| ΔT [°C] | | 7.2 | |
| Peak Temp. [°C] | 239.4 | 232.9 | 240.1 |
| Time[sec] over 220°C | 29.0 | 24.4 | 27.8 |
| Time[sec] over 200°C | 41.4 | 35.8 | 37.0 |

(e)

| Items | Simulation − Verification | | |
|---|---|---|---|
| | 3a | 3b | 3c |
| ΔT [°C] | | −1.4 | |
| Peak Temp. [°C] | −3.4 | −1.9 | −3.3 |
| Time[sec] over 220°C | −3.3 | −2.4 | −2.2 |
| Time[sec] over 200°C | −2.4 | −1.1 | 0.9 |

(f)

| Heating Sections | VII | VI | V | IV | III | II | I |
|---|---|---|---|---|---|---|---|
| Heating Temp. | 254 | 292 | 180 | 180 | 180 | 263 | 263 |

V=1.35m/minute (g)

| Items | Simulation | | |
|---|---|---|---|
| | 3a | 3b | 3c |
| ΔT [°C] | | 8.5 | |
| Peak Temp. [°C] | 238.3 | 230.3 | 238.8 |
| Time[sec] over 220°C | 27.0 | 21.2 | 24.8 |
| Time[sec] over 200°C | 37.8 | 32.6 | 35.0 |

(h)

| Items | Verification | | |
|---|---|---|---|
| | 3a | 3b | 3c |
| ΔT [°C] | | 7.9 | |
| Peak Temp. [°C] | 238.3 | 231.3 | 239.2 |
| Time[sec] over 220°C | 27.0 | 22.0 | 25.0 |
| Time[sec] over 200°C | 38.8 | 32.8 | 35.4 |

(i)

| Items | Simulation − Verification | | |
|---|---|---|---|
| | 3a | 3b | 3c |
| ΔT [°C] | | 0.6 | |
| Peak Temp. [°C] | 0.0 | −1.0 | −0.4 |
| Time[sec] over 220°C | 0.0 | −0.8 | −0.2 |
| Time[sec] over 200°C | −1.0 | −0.2 | −0.4 |

Fig. 13
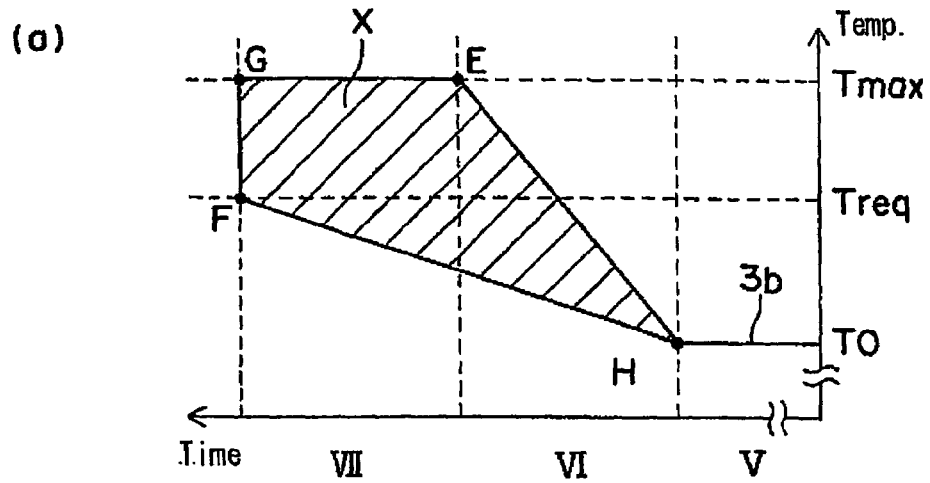
(a)
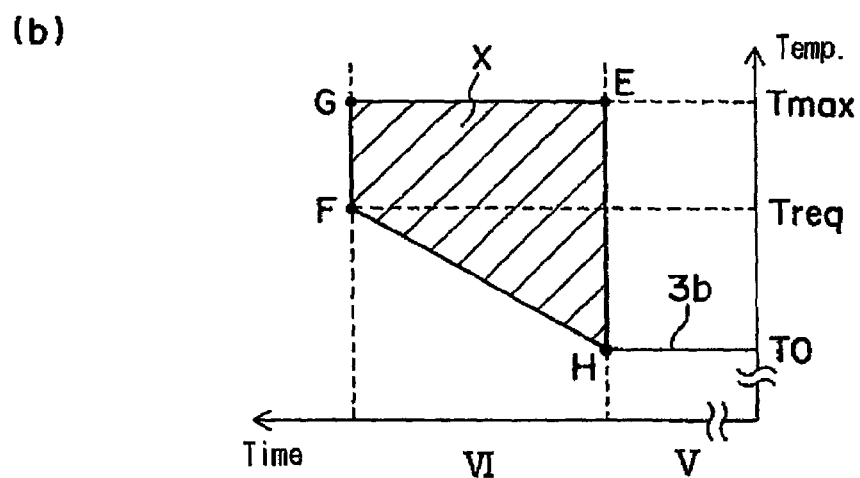
(b)
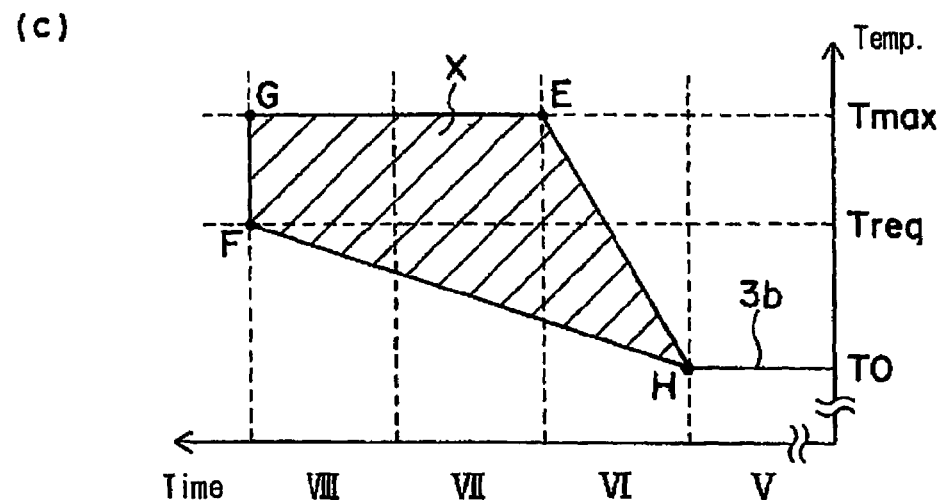
(c)

Fig.15

(a)
Unit:Second

| Items | 3a | 3b | 3c |
|---|---|---|---|
| Time(t2) over Targeted Heating Temp.(T2) | 22 | 21 | 25 |
| Time(t1) over Allowable Limited Temp.(T1) | 40 | 39 | (42) |

(b)
Unit:Second

| Items | 3a | 3b | 3c |
|---|---|---|---|
| Time(t2) over Targeted Heating Temp.(T2) | 20 | (18) | 22 |
| Time(t1) over Allowable Limited Temp.(T1) | 38 | 37 | 40 |

(c)
Unit:Second

| Items | 3a | 3b | 3c |
|---|---|---|---|
| Time(t2) over Targeted Heating Temp.(T2) | 21 | 20 | 23 |
| Time(t1) over Allowable Limited Temp.(T1) | 39 | 38 | (41) |

METHOD, APPARATUS AND PROGRAM OF THERMAL ANALYSIS, HEAT CONTROLLER AND HEATING FURNACE USING THE METHOD

BACKGROUND OF THE INVENTION

The present invention relates to a method of thermal analysis for determining an appropriate heating condition for heating an object in accordance with a required temperature profile. The present invention also relates to an apparatus of thermal analysis, a heat controller and a heating furnace using such a method. More specifically, the present invention relates to a method of thermal analysis, and a reflow furnace using such a method for determining a proper heating condition for heating a circuit substrate. Electronic components are mounted on the circuit substrate via cream solder which is melted when heated. After the circuit substrate is cooled, the melted cream solder solidifies, thereby welding the electronic components onto the circuit substrate. The present invention also relates to a program and a computer readable recording medium recording such a program, which may be used for making a computer process the method of thermal analysis.

When heating an object in a heating furnace, it is necessary to control heating temperature and heating time in a predetermined manner so as to keep the object at a proper temperature for a certain period of time and not to overheat beyond the upper limit temperature of the object. Prudent thermal analysis and temperature control is critical for not only keeping the object at such proper temperature for a certain period of time in a heating furnace, but also for heating the object in accordance with a required temperature profile during preheating, main heating and cooling stages.

The following description is made by referring to a reflow furnace as an example, which is used for soldering electronic components onto a circuit substrate such as an electronic circuit board (herein after referred to as a "circuit board"). In a reflow process, at first, cream solder is printed on a circuit board, and electronic components are mounted on the circuit board at corresponding predetermined positions. The circuit board is then introduced into a reflow furnace for heating and melting the solder, thereby soldering and securing the components onto the circuit board. In order to avoid any heat destruction of the object (i.e., electronic components as well as the circuit board) due to steep temperature increase in the reflow furnace, the object is first heated at a relatively low temperature at a preheat stage. Such heating at the preheat stage is also preferable to activate fluxes contained in the cream solder, such as anti-oxidization flux, for improving soldering quality. The object is then heated at a reflow stage, where the object is kept at a temperature over a melting point of the solder for a predetermined period of time so that the solder may be completely melted. After the reflow stage, the object is cooled for solidifying the solder to secure the electronic components onto the circuit board.

In view of a recent environmental conservation demand, a trend has existed for some time that conventional solder materials made from tin-lead compound are being replaced by lead-free materials, such as tin-zinc-bismuth compound, which do not contain any poisonous materials. The melting point of such lead-free solders is generally somewhere around 220° C., which is higher than the melting point of about 190° C. for lead-based solders. Therefore, the lead-free materials should be heated at a higher temperature than the conventional solder during the reflow heating operation for complete melting. On the other hand, in order to prevent any heat destruction of the electronic components and the circuit board during such heating, the object, or the circuit board having electronic components thereon, should not be heated over the upper limit temperature, which is a temperature at which all the components and the circuit board may endure and sustain their intended functions. For example, in case one of the electronic components to be mounted on the circuit board is an aluminum electrolytic condenser, such upper limit temperature is about 240° C. This means that when the heating temperature for heating the object is too low (e.g., below 220° C.), the electronic components may not be securely soldered onto the circuit board, while on the other hand, when the heating temperature is too high (e.g., over 240° C.), the electronic component may be damaged. Consequently, as described above, severe temperature control for heating the solder at a temperature over its melting point, and yet at lower temperature than the upper limit temperature of the respective components is needed for achieving reliable soldering operation in the reflow furnace. Toward this end, heating conditions including the temperature of a heating source, such as heat blower or a heat panel, and transfer speed for moving the object through the heating furnace should be properly determined in accordance with a temperature profile corresponding to required heating conditions for heating the respective object.

There are two types of heating methods applicable to heating furnaces. One of the methods is convection type heating in which heated air from a heat source such as electricity or burning gas or oil is blown toward the object, and another method is radiation type heating in which a heat source such as an infrared radiation heat source radiates heat toward the object. There is a variety of heating equipment, such as a reflow furnace, a heat treatment furnace, a sintering furnace, a baking oven such as that used for making ceramics, a melting furnace, or incinerating equipment. Depending on a purpose of heating and/or a kind of heating equipment, an appropriate heating type may be selected. In case when severe temperature control is required, such as for a reflow furnace for soldering electronic components onto a circuit board, convection type heating is typically selected because of its relatively easy temperature controlling capability.

In a conventional way of determining reflow heating conditions, at least one thermocouple is fixed to the circuit board, and temperature change at such a fixed point is measured during heating. Such measurement is repeated by changing a heating condition of the reflow furnace one after another until an appropriate heating condition is identified. Each time of changing the heating condition, a relatively long period of time is required for waiting for the temperature of the furnace to become in a stable condition for the next trial. Typically, such repetition is required for about ten times until the appropriate heating condition is determined. In addition to such lengthy time for waiting, inspiration and experience of a skilled operator is inevitable for setting a subsequent heating condition based on preceding measurement results. Moreover, even if an appropriate heating condition is determined through such trial and error efforts, it is sill not certain as to whether such a heating condition is optimum or not, namely, whether such a heating condition may easily meet the required conditions, or barely meet the conditions.

In the prior art, some alternative methods of determining reflow heating conditions have been proposed for avoiding such a laborious method with lengthy operations conducted by a skilled operator. Japanese patent application laid open to public No. 45961/2002-A discloses a method for determining an optimum heating condition, including steps of:

heating a test sample with known physical characteristics in a heating furnace, and measuring a temperature change thereof;

processing the temperature change with a differential equation by using a heating feature of the heating furnace as a parameter; and repeating such processing by changing a value representing the heating feature of the heating furnace until a difference between the measured value and the processed value becomes minimum.

Japanese patent application laid open to public No. 201947/1999-A (U.S. Pat. No. 3,274,095) discloses a method of controlling a heat source including steps of:

setting a heating condition for each of a plurality of heating sources to be used for heating an object;

heating the object and detecting temperatures of a plurality of detecting points of the object;

calculating a relationship between a difference of the heating condition for each heat source and a difference of the detected temperature of each detecting point of the object, and based on the result of the calculation, determining a heating condition for each heating source that may make the temperature of the object to be the same as the targeted temperature.

Both of these methods, however, require physical characteristics of the object (or a test piece) in order for determining an optimum heating feature or controlling the heating source. Accordingly, it is necessary to obtain individual physical characteristic data of the object, and input these data beforehand. Especially in these days, one circuit board typically has about 100 electronic components to be mounted thereon. Design changes and component combination changes occur very often. In view of these circumstances, it is rather difficult at an operation sight to implement such complicated and time consuming methods which require obtaining physical characteristics for individual measuring points, or electronic components, of the object. In some cases, such as the case when the object is formed by mixed components or a combination of many components, obtaining physical characteristics of those components is difficult.

U.S. Pat. No. 6,283,378 discloses a method of adjusting a boundary condition temperature of a heating furnace having a plurality of heating sections, including steps of:

measuring both of a boundary condition temperature and a blowing heat temperature for each of the heating sections, and adjusting the boundary condition temperature by an amount equivalent to a minimum difference between the boundary condition temperature and the blowing heat temperature among the differences for all of the heating sections. According to this method, however, adjustment is made only by parallel translation of a temperature profile, which is to move a temperature profile based on a single factor without considering respective differences at each of the boundaries of the heating sections. Therefore, it is difficult to perform an accurate simulation, especially when a peak temperature of the object does not exist at said boundary, or when the temperature profile is formed by complicated curves. Moreover, since an adjustment of the heating furnace as a whole is made by a single temperature control, there exists a problem that specific heating conditions at each of the plurality of measuring points are neglected.

Accordingly, in view of the above mentioned problems of the conventional methods, the purpose of the present invention is to provide a method and an apparatus of thermal analysis as well as a heating furnace which may be used for determining a proper heating condition of a heating furnace in an effective manner, without requiring physical characteristics of the object to be heated, or without conducting repetitive heating and measuring processes of a sample object in a trial and error manner.

It is also a purpose of the present invention to provide a heat controller capable of implementing the above mentioned method, computer readable recording medium which can be used for the heat controller, and a program to be recorded in such a recording medium.

SUMMARY OF THE INVENTION

The present invention resolves the above described problems by providing a method and apparatus of thermal analysis which may determine a single invariable representing a heating characteristic at each measuring point of the object to be heated at each measuring location of a heating furnace based on heating temperature and heating time of the measuring location and measured temperature of the measuring point. More specifically, the present invention includes the following.

One aspect of the present invention relates to a method of thermal analysis, wherein a heating characteristic at any measuring point of an object at any measuring location of a heating furnace is determined as a single invariable by using temperature measured at the measuring point of the object and heating temperature and heating time at the measuring location of the heating furnace. Such heating characteristic represents physical characteristics of both of the heating furnace and the object to be heated.

By using such an invariable, it becomes possible to simulate a temperature profile of an object when the object is heated under a given heating condition in the heating furnace. Or in the opposite manner, it becomes possible to determine an appropriate heating condition for heating an object in the heating furnace in accordance with given required conditions.

The invariable described above may be an m-value defined by:

$$m = \frac{1}{t}\ln\left[\frac{Ta - Tint}{Ta - Ts}\right]$$

wherein ln is natural logarithm, Ta is heating temperature of the measuring location of the heating furnace, Tint is initial temperature of the measuring point of the object at the measuring location, Ts is achieved temperature when the object is heated at the measuring location, and t is heating time at the measuring location.

By using the m-value, heating temperature Ta and heating time t of the heating furnace for satisfying a temperature Ts of the object may be determined based on a basic equation for heating defined by:

$$Ts = Ta - (Ta - Tint)e^{-mt}$$

wherein e in the equation represents the base of natural logarithms. Or in a opposite manner, temperature Ts of the object may be simulated when heating temperature Ta and heating time t of the heating furnace are given.

Another aspect of the present invention relates to a program for making a computer process steps of determining an appropriate heating condition of a heating furnace having a plurality of heating sections forming a first and a second heating stages for heating an object in accordance with a required temperature profile corresponding to predetermined required conditions for each of the first and the second stages, said steps comprising:

obtaining a heating characteristic value for at least one measuring location of each of said plurality of heating sections calculated from heating temperature and heating time at said measuring location as well as a measured temperature of at least one measuring point of the object when the object is heated under a certain heating condition at the measuring location, electing one measuring point which has achieved the highest temperature during heating at the first heating stage among all the measuring points, and confirming whether temperature of the elected measuring point is not over the upper limit of the required conditions (confirmation step A);

when temperature of the elected measuring point is over the required conditions of the first heating stage at the confirmation step A, modifying the heating condition by lowering the heating temperature based on a predetermined rule and simulating temperature at each measuring point under the modified heating condition by using the corresponding heating characteristic value, and repeating the above procedures from the confirmation step A;

when temperature of the elected measuring point is not over the required conditions of the first heating stage at the confirmation step A, confirming whether or not the elected measuring point meets heating time of the required conditions of the first heating stage (confirmation step B);

when the heating time of the elected measuring point falls short of the required conditions of the first heating stage at the confirmation step B, modifying the heating condition by raising the heating temperature based on a predetermined rule or by lengthening the heating time based on a predetermined rule and simulating temperature for each measuring point under the modified heating condition by using the corresponding heating characteristic value, and repeating the above procedures from confirmation step A;

when the heating time of the elected measuring point goes over the required conditions of the first heating stage at the confirmation step B, modifying the heating condition of the first heating stage by lowering the heating temperature based on a predetermined rule or by shortening the heating time based on a predetermined rule and simulating temperature for each measuring point under the modified heating condition by using the corresponding heating characteristic value, and repeating the above procedures from the confirmation step A;

when the heating time of the elected measuring point meet the required conditions of the first heating stage at the confirmation step B, confirming whether or not all the other measuring points meet the required conditions of the first heating stage (confirmation step C);

when any one of the measuring points does not meet the required conditions of the first heating stage at the confirmation step C, modifying the heating condition by lengthening the heating time of the first heating stage based on a predetermined rule or by raising the heating temperature of the first heating stage based on a predetermined rule and simulating temperature for each measuring point under the modified heating condition by using the corresponding heating characteristic value, and repeating the above procedures from the confirmation step A;

when all the measuring points meet the required conditions for the first heating stage at the confirmation step C, electing one measuring point, as a critical measuring point, which has achieved the lowest temperature at the second heating stage during heating among all the measuring points;

detecting a heating condition of each of the heating sections in the second heating stage which may make said critical measuring point to satisfy both of the required upper end temperature that the object needs to achieve and the maximum temperature that the object should not go over, by simulating temperature of the critical measuring point by using the corresponding heating characteristic value for each of the measuring locations in the second heating stage based on a predetermined algorithm, confirming whether or not any of the detected heating conditions at the detecting step meet targeted heating temperature and heating time that the object needs to clear for fulfilling the purpose of heating (confirmation step D);

when none of the detected heating conditions meet the targeted heating temperature and heating time at the confirmation step D, modifying the heating condition by lengthening the heating time based on a predetermined rule and simulating temperature at each measuring point under the modified heating condition by using the corresponding heating characteristic value, and repeating the above procedures either from the step of electing the critical measuring point or from the confirmation step A;

when any one of the detected heating conditions meet the targeted heating temperature and heating time at the confirmation step D, confirming whether such detected heating condition(s) meet other required conditions of allowable limited temperature and time that the object may endure during heating (confirmation step E);

when none of the detected heating condition(s) meet the allowable limited temperature and time at the confirmation step E, modifying the heating condition by shortening the heating time based on a predetermined rule and simulating temperature at each measuring point under the modified heating condition by using the corresponding heating characteristic value, and repeating the above procedures either from the step of electing the critical measuring point or from the confirmation step A;

when any one of the detected heating condition(s) meet the allowable limited temperature and time at the confirmation step E, temporarily electing one detected heating condition that has cleared the allowable limited temperature and time requirement by the shortest time among all the detected heating condition(s) as the appropriate heating condition for satisfying the required temperature profile;

confirming whether all the other measuring points meet the required conditions of the second heating stage by simulating temperatures under the temporarily elected heating condition by using the corresponding heating characteristic values of the other measuring points (confirmation step F);

when any of the measuring points do not meet the required conditions of the second heating stage at the confirmation step F, modifying the temporarily elected heating condition by shortening heating time based on a predetermined rule and simulating temperature of each measuring point under the modified heating condition by using the corresponding heating characteristic value, and repeating the above procedures either from the step of electing the critical measuring point or from the confirmation step A; and when all the measuring points meet the required conditions for the second heating stage at the confirmation step F, determining that the temporarily elected heating condition is appropriate for satisfying the required temperature profile.

The first heating stage and the second heating stage may be arranged either in a combined process as shown in the above program, or in separate processes.

The predetermined algorithm for detecting heating conditions for making the critical measuring point to satisfy both of the required upper end temperature and the maximum temperature in the above program may be configured by the steps of:

creating combinations of heating conditions of at least two heating sections by raising respective heating temperatures independently by every predetermined amount from the initial temperature of the object at the beginning of the heating section up to a predetermined upper limit temperature defined by the heating furnace;

simulating temperature of the critical measuring point under each of the created combinations of the heating conditions, and developing temperature profiles corresponding to each of the combinations of the heating conditions; and detecting any of the combinations of the heating conditions which may make the corresponding simulated temperature to be located inside a zone defined by said at least two heating sections, which zone is surrounded by an upper boundary and a lower boundary, wherein the upper boundary comprising a temperature increase line between a point H of an initial temperature of the preceding heating section and a point E of the maximum temperature at the end of the same heating section as well as a line of the maximum temperature between said point E and a point G at the end of said at least two heating sections, while the lower boundary comprises a line between said point H and a point F of the required upper end temperature at the end of said at least two heating sections.

Yet another aspect of the present invention relates to an apparatus for performing thermal analysis to be used for heating an object in a heating furnace, comprising an input means, a memory and a processor, wherein said input means obtains information of heating temperature and heating time of the heating furnace and temperature of the object, said memory stores a logic for calculating a heating characteristic value, and a basic equation for heating or logic for calculating a temperature of the object to be heated by using said heating characteristic value as well as the heating temperature and heating time, and said processor calculates either said heating characteristic value or temperature of the object corresponding to the heating temperature and the heating time, by using said logic and said basic equation for heating stored in the memory. The apparatus may further include a reading means for reading a recording medium, in which case, the processor may determine an appropriate heating condition including heating temperature and heating time that satisfies the required conditions of the object to be heated, by using the required conditions for heating the object obtained by the input means, the algorithm that the reading means obtains by reading the recording medium, and the heating characteristic value calculated by the processor.

The above apparatus may be used as a heat controller by adding an input means, which heat controller may determine an appropriate heating condition including heating temperature and heating time for each of heating sections structured in a heating furnace. The heat controller may also control the heating furnace based on such determined appropriate heating condition so as to heat an object in accordance with a required temperature profile corresponding to required conditions for heating the object.

Yet another aspect of the present invention relates to a heating furnace for heating an object introduced into the furnace in accordance with a required temperature profile corresponding to required conditions for heating the object, said heating furnace comprising at least one heating section, a heat source provided to each of the heating sections for heating the object, and a heat controller capable of controlling a heating condition for each of the heating sections. The heating furnace is provided with the heat controller described above.

The heating furnace described above may be either one of a reflow furnace, a heat treatment furnace, a sintering furnace, a baking oven, a melting furnace, and incinerating equipment.

BRIEF DESCRIPTION OF THE DRAWINGS

The present invention will be described in more detail by referring to the accompanying drawings, in which:

FIG. 5 shows the result of experiment 1 for simulating temperature according to one embodiment of the present invention, FIG. 6 shows the result of experiment 2 for simulating temperature according to one embodiment of the present invention, FIG. 9 shows the result of experiment 3 for simulating temperature according to one embodiment of the present invention, FIG. 13 shows an algorithm to detect the heating condition at the second heating stage of the flowchart shown in FIG. 11, FIG. 14 schematically shows another algorithm to detect the heating condition at the second heating stage of the flowchart shown in FIG. 11, FIG. 15 shows some examples obtained by a thermal analysis according to the present invention.

DETAILED DESCRIPTION OF THE PREFERRED EMBODIMENTS

Figure 1:
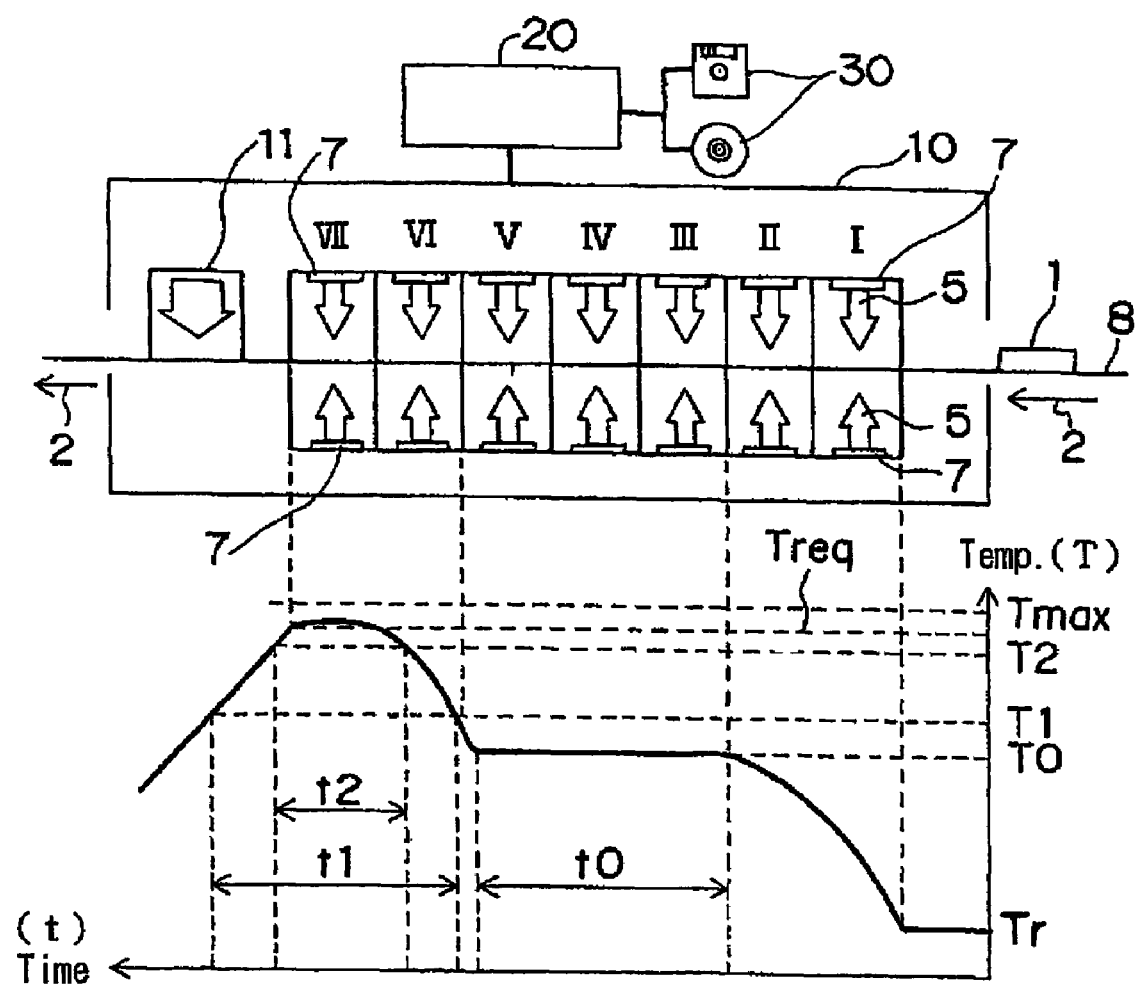
FIG. 1 illustrates an embodiment of the reflow heating furnace according to the present invention, and a typical temperature profile of an object to be heated in the heating furnace.

The first embodiment of a method and an apparatus of thermal analysis according to the present invention will be described hereinafter. In the following description, a reflow furnace used for soldering is discussed as an example, but it should be noted that the present invention is not limited thereto. FIG. 1 shows an example of a reflow furnace (upper half of the drawing), and a temperature profile of the object (lower half of the drawing) when the object is heated in the reflow furnace. A heating object, or a circuit board 1 having a plurality of electronic components mounted thereon in this case, is introduced into the reflow furnace 10 from the right side of the drawing by means of a transfer device 8. The circuit board 1 is then moved through the reflow furnace 10 in a direction shown by arrows 2 from right to left, and eventually transferred out of the reflow furnace 10 to the left side after heating. During the course of this movement in the heating furnace 10, cream solder printed on the circuit board 1 is melted, and thereby electronic components mounted on the circuit board 1 are soldered (i.e., welded) onto the circuit board 1. Inside of the reflow furnace 10 shown in FIG. 1, seven heating sections I-VII are structured, and each of the heating sections I-VII has an individual heat source 7. Each of the heat sources 7 blows temperature-controlled heated air toward the circuit board 1 from both the upper side and the lower side as shown by arrows 5, so that the object, or the circuit board 1 and the electronic components, is heated up to a required temperature.

The lower half of FIG. 1 illustrates temperature change, or a temperature profile of the object heated in the reflow furnace 10. The circuit board 1 is introduced into the reflow furnace 10 at temperature Tr (normally, room temperature), and is gradually heated and reaches up to preheat temperature T0 at the heating section III, and is maintained at that temperature T0 for a time t0.

Then, the circuit board 1 is heated up to temperature T2 at heating section VI, which is a temperature necessary for melting solder (targeted heating temperature), and is kept at that temperature T2 in the heating sections VI and VII for a time t2 in total for melting the solder. After the solder is melted completely, the circuit board 1 is transferred out of the heating section VII, and is cooled down to atmosphere temperature level. During this cooling process, melted solder is solidified, and the mounted electronic components are secured onto the circuit board 1. A cooling device 11 may be used for facilitating cooling by blowing air or cooled air toward the circuit board 1. The illustrated temperature profile is only an example, and other required temperature profiles may be achieved by modifying the heating condition of each of the heating sections I-VII.

For the case of heating in the reflow furnace 10 where achieving complete soldering of electronic components and avoiding heat destruction of these electronic components are required, some form of required conditions for heating are imposed for appropriately controlling heating of the reflow furnace 10, such as conditions (a) to (f) listed below. These conditions are also illustrated in FIG. 1. It is to be understood that such conditions may be applicable to solder reflow purpose, and some other conditions may also be arranged depending on the purpose of heating.

(a) Targeted heating temperature and heating time (T2, t2): These are for keeping the object at a required temperature for a required time depending on a purpose of heating. In case of solder reflow heating, such heating temperature and heating time are necessary for keeping solder at above its melting point for a certain period of time to achieve complete melting.

(b) Required upper end temperature (Treq): This is a temperature that the peak temperature of the object needs to achieve during heating process. In case of solder reflow heating, this temperature is needed for transforming the solder into a completely liquefied phase.

(c) Maximum temperature (Tmax): This is a maximum temperature that the object should not go over. In case of solder reflow heating, this is the upper limit temperature for avoiding heat destruction of the electronic components as well as the circuit board.

(d) Allowable limited temperature and time (T1, t1): These are limited temperature and time requirement that the object may endure during heating operation. In case of solder reflow heating, the electronic components and the circuit board should endure heating at this level of temperature and time without causing any heat destruction.

(e) Preheat temperature and time (T0, t0): This temperature and time are required for heating the object before main heating for the required purpose. In case of solder reflow heating, these preheat conditions are for activating flux of cream solder, and for avoiding heat destruction of the electronic components due to steep temperature increase in reflow stage.

(f) Temperature variation ($\Delta t$): This is a maximum allowable temperature difference among a plurality of measuring points of the object. In case of solder reflow heating, it is desirable to avoid any local temperature variances among electronic components. Since FIG. 1 shows a temperature profile for only a single measuring point (i.e., a single electronic component), this temperature variation $\Delta t$ is not shown in the drawing.

It is necessary to determine an appropriate heating condition for each of the heating sections I-VII so that the heating object 1 may satisfy all of these required heating conditions during a heating operation while the object is moved through the reflow furnace 10.

Figure 2:
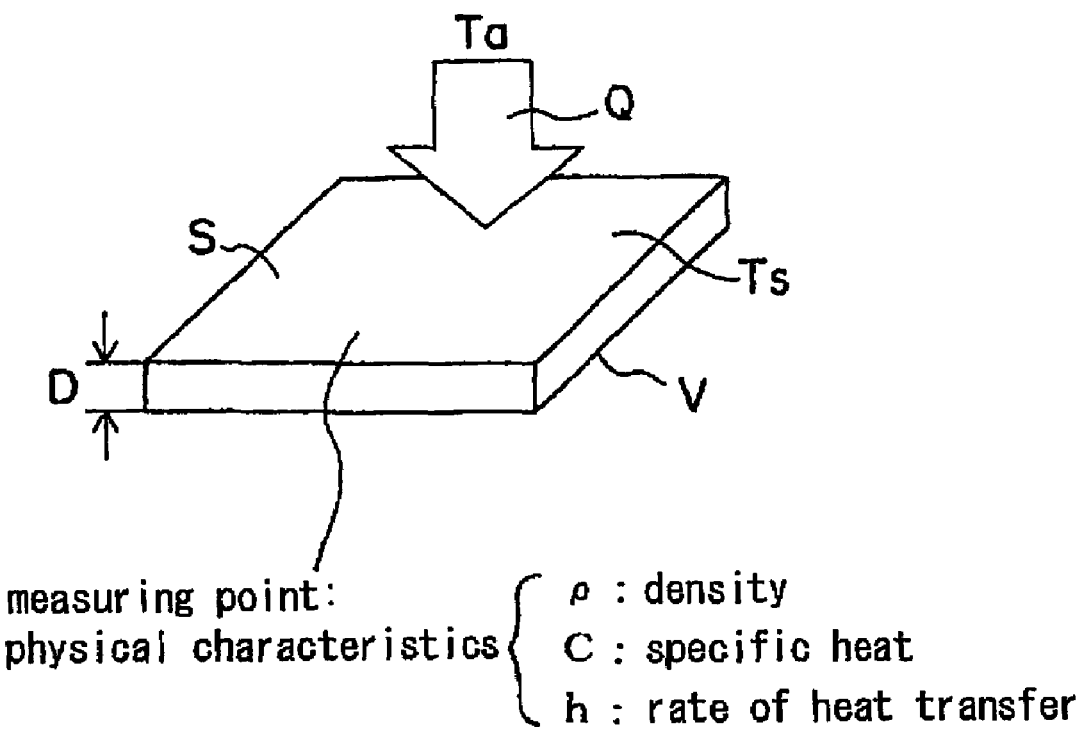
FIG. 2 shows energy transferring relations between the heating furnace and the object to be heated.

Now, some equations representing thermal relations between the heat source and the heating object are introduced. FIG. 2 shows one measuring point (i.e., one electronic component) on the heating object 1, and an energy to be applied to the measuring point. In this case, convection type heating by blowing heated air is used. The measuring point has front surface S, thickness D, volume V, and physical characteristics of density $\rho$, specific heat C and rate of heat transfer h for convection type of heating. When temperature of the heated air to be blown is Ta, and the surface temperature of the measuring point is Ts, heat energy Q to be transferred is shown by the following equation:

$$Q = h(Ta - Ts)S \qquad (1)$$

Temperature change $\Delta T$ of the surface temperature Ts of the measuring point during $\Delta t$ seconds is generally represented by:

$$\frac{\Delta T}{\Delta t} = \frac{S}{\rho CV}\{h(Ta - Ts) + \alpha \varepsilon F(Th^4 - Ts^4)\} \qquad (2)$$

This equation may be modified to:

$$\frac{\Delta T}{\Delta t} = \frac{hS}{\rho CV}(Ta - Ts) + \frac{\alpha \varepsilon FS}{\rho CV}(Th4 - Ts4) \quad (3)$$

The latter half of the right side of the Equation 3 represents an element of radiation type heating, in which α is a rate of radiation absorption of the measuring point, ε is a rate of radiation of the measuring point, F is a configuration factor between the heating source and the measuring point, and Th is a temperature of the heat source (surface temperature) of radiation.

In case of convection type heating, the effect of such radiation type heating is typically negligibly small. Accordingly, the latter half of the right side of the equation may be eliminated for the case of convection type heating, in which case, the Equation 3 may be modified to:

$$\frac{\Delta T}{\Delta t} = \frac{hS}{\rho CV}(Ta - Ts) \quad (4)$$

By introducing a value of "m" represented by the following:

$$m = \frac{hS}{\rho CV} \quad (5)$$

the Equation 4 may be modified to:

$$\frac{\Delta T}{\Delta t} = m(Ta - Ts) \quad (6)$$

When the temperature Ts at an initial timing (i.e., t=0) is assumed to be Tint, the Equation 6 may be modified to:

$$Ts = Ta - (Ta - Tint)e^{-mt} \quad (7)$$

In the Equation 7, both Ts and Tint represent surface temperature of the object, wherein Tint is the initial temperature at the beginning of heating, while Ts is an achieved temperature when the object is heated. Also in Equation 7, "e" represents the base of natural logarithms. In this specification, the Equation 7, which may be used for determining surface temperature Ts of the object, is hereinafter referred to as a "basic equation for heating".

By using the Equation 7, "m" shown in Equation 6 may be modified to:

$$m = \frac{1}{t}\ln\left[\frac{Ta - Tint}{Ta - Ts}\right] \quad (8)$$

"ln" in the Equation 8 represents natural logarithm. Among the elements in right side of the Equation 8, heating time t, heating temperature Ta, initial temperature Tint, and achieved temperature Ts are all measurable. Accordingly, when these elements are measured, the value of the "m" may be calculated by using these measured results. This means that, once the object is heated, and those values in right side of the Equation 8 are measured during such heating, the value of "m" may be determined by using the Equation 8, without knowing any physical characteristics of the object, such as density ρ, specific heat C, or rate of heat transfer h of the object shown in the Equation 5. In this specification, such calculated value of "m" is hereinafter referred to as an "m-value". As the m-value calculated from the Equation 8 is on a basis of the actually measured values of the object heated by a specific heating furnace, such m-value may be considered as a "heating characteristic" defined by a single quantified invariable. As is understood, the heating characteristic apparently represents physical characteristics of both the object and the heating furnace where the measurement is made.

The above mentioned physical characteristics of both the heating furnace and the object include, but are not limited to, the following.

Heating furnace: structure of furnace, inner volume, type of heat source, number and layout of heating sections, response of the heat source, heat interference, outer disturbance, etc.

Heating object: physical characteristics (surface area S, thickness D, specific heat C, rate of heat transfer h, etc.), configuration, initial temperature, surface conditions, etc. Especially for the case of a circuit board, mounting density and mounting locations of the electronic components, and circuitry layout on the surface of the substrate, etc. are also included.

In this specification, all of these factors related to heating features for both of the heating furnace and the object are referred to as "heating characteristic". The m-value may be considered as a single quantified invariable of "heating characteristic value" representing all these factors.

When an object is heated in a heating furnace, it is natural that the heating condition may differ on a point by point basis even in a single object. In the conventional thermal analysis relying on only physical characteristics of the object, the above mentioned variety of factors of heating characteristics are disregarded, hence simulation results may fluctuate. On the contrary, according to the present invention, such a drawback is avoided, since the m-value which represents all the factors affecting heat condition is used. Namely, by using the m-value, more practical and more accurate simulation results may be obtained in comparison with the conventional simulation using individual physical characteristics.

Figure 3:
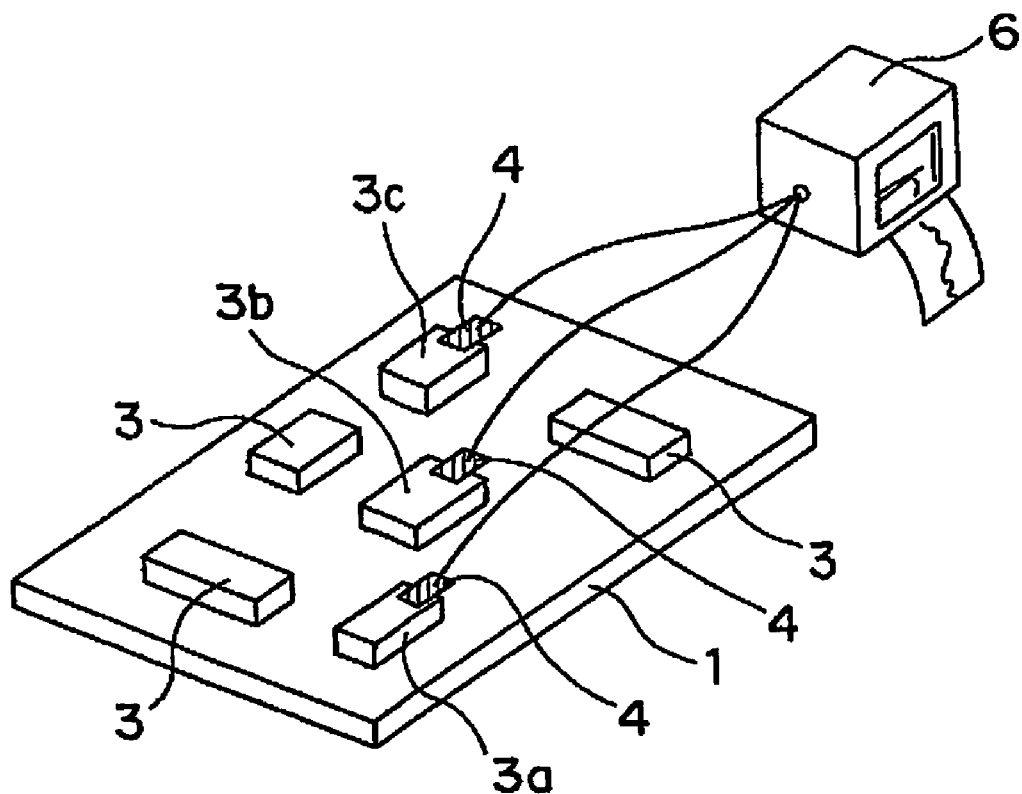
FIG. 3 shows a sample object to be heated, and devices for measuring temperature at measuring points of the object.

FIG. 3 schematically illustrates a sample circuit board 1 to be used for determining the m-value. A plurality of electronic components 3 are mounted on the sample circuit board 1, and thermocouples 4 are attached to three of these components 3a, 3b and 3c which are selected as measuring points. These thermocouples 4 are connected to outside recording device 6 for recording outcomes. The outcomes may be further transmitted from the recording device 6 to a computer or a heat controller via A/D converters, all of which are not shown in the drawing. Although only three components 3a, 3b and 3c are selected as measuring points in the drawing, the number of components to be measured are not limited to three. Generally, it is desirable to identify heating features (or restrictions) of all the components to be mounted on the circuit board, and to pick up some representative components that are in thermally critical conditions, or components that are relatively difficult to raise temperature for their size and/or heat capacity for selected measuring points.

Figure 4:
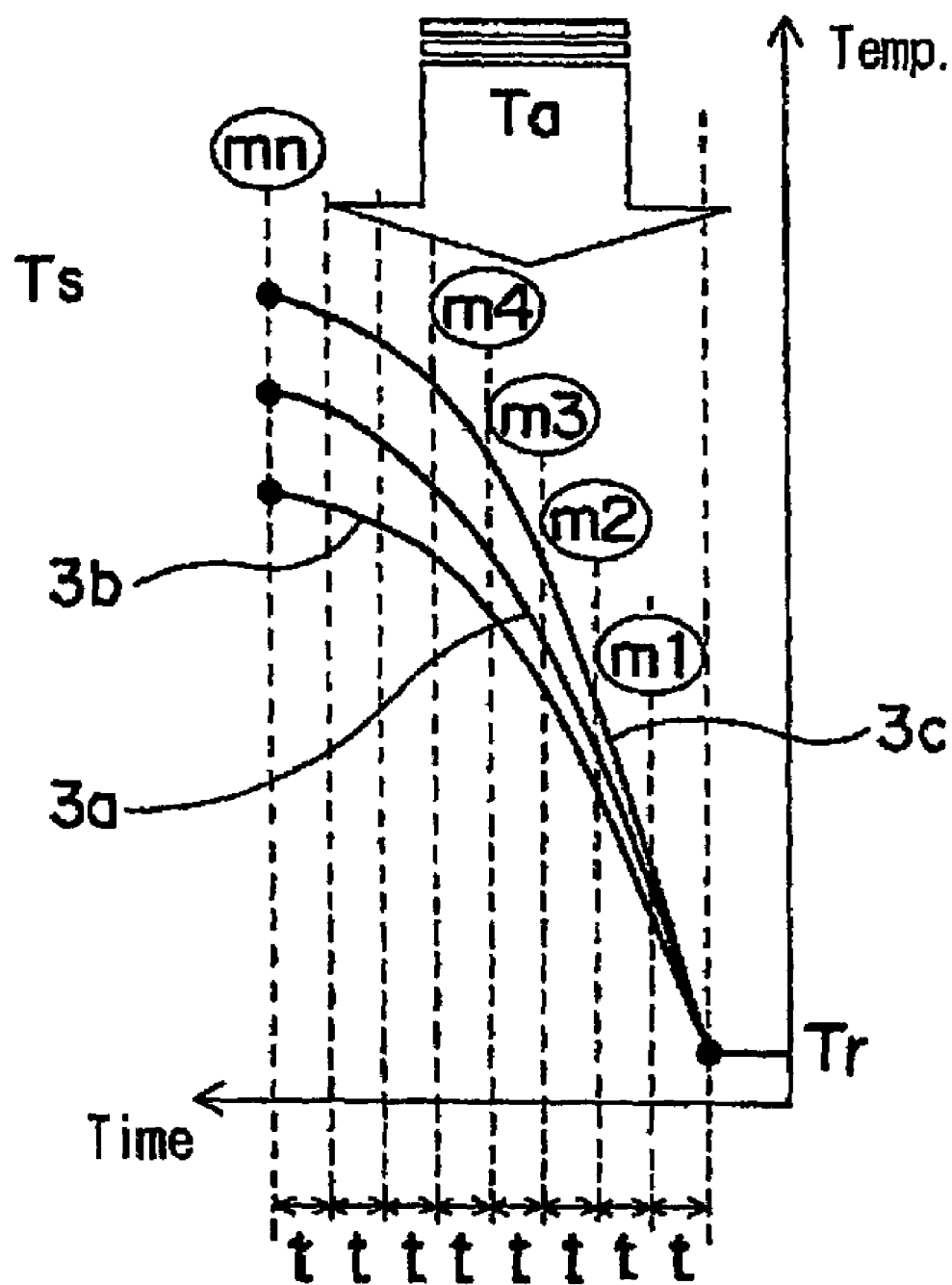
FIG. 4 illustrates measuring locations of one of the heating sections of the heating furnace where m-values are to be determined.

FIG. 4 shows measuring locations in one of the heating sections, in this case heating section I of reflow furnace 10 shown in FIG. 1. These measuring locations are the places where the m-values are to be determined. The vertical line in the drawing represents temperature of the measuring points (object), and the horizontal line represents time. In this specification, "measuring point" and "measuring location" differ from each other in that the "measuring point" is a place of the object to be heated where temperature is measured, while the "measuring location" is a place of the heating furnace where temperature is measured (i.e., a place of the heating furnace where the m-value is determined.). Although the horizontal line in the drawing represents time, this may be interpreted as measuring locations where the object passes at every t seconds. In the illustrated example, there are n (number) measuring locations in the heating section I having a common distance among each other, and the number n may be set at any desired number. The object is heated at each of these measuring locations during a time t, and the temperature of the object raised gradually as time goes by, or as the object moves from right to left in the drawing. The measuring locations do not necessarily have a common distance among each other, but rather each distance may be at any length.

The sample circuit board 1 at room temperature Tr is introduced into the heating furnace, and it is heated at each measuring location by heated air of temperature Ta which is blown from the respective heat source 7 (see FIG. 1). During the time temperatures of the measuring points 3a, 3b and 3c gradually raise from room temperature Tr, respective surface temperatures Ts are measured. Total n (number) of the m-values (m1, m2, m3 . . . , and mn) are calculated by using measured temperatures based on the Equation 8. In the Equation 7 and 8, the initial temperature Tint at each measuring location is given by the achieved temperature Ts of the preceding measuring location.

Although the m-values for only the electronic component 3a are shown in FIG. 4, total n of the m-values for each of the other components 3b and 3c are also calculated by measuring respective temperatures at each of the corresponding measuring locations. According to the experiment conducted by the present inventors, 100 measuring locations in a single heating section are elected (i.e., n=100), and total 100 m-values are calculated for each of the measuring points. The reason why so many measuring locations are elected is that the heating condition even in a single heating section may vary depending upon temperature variation of the heated air and/or variation of blowing velocity of heated air, and especially at the entrance section of the heating furnace or at the boundary between the two adjacent heating sections. Some effects caused by outside air and/or heat interference among heating sections are inevitable, and hence determining a large number of heating characteristics by narrowing each of the measuring locations is desirable for performing accurate simulation. On the contrary, in a case in which only a general feature of the heating furnace is needed, it may be sufficient, in the extreme case, to calculate only one m-value for each heating section, or even a single m-value of the most critical section of the entire heating furnace.

Although FIG. 4 shows only heating section I, in a similar manner, temperatures at each of the measuring locations for other heating sections II-VII are also measured, and thereby the m-values are calculated for all of these locations. Assuming that each of the other heating sections also has 100 measuring locations, the grand total of m-values to be calculated is 2100 (100 locations×7 sections×3 measuring points), and all these values are transmitted to a computer and/or a heat controller.

Now, a method of performing a simulation for identifying a temperature profile of the heated object due to a changing heating condition of the reflow furnace by using the calculated m-value for each measuring point and measuring location will be described hereinafter. As mentioned above, according to the present invention, the m-value representing the heating characteristic may be determined based upon actual heating and measuring of the sample circuit board, without using physical characteristics such as density $\rho$, specific heat C, or rate of heat transfer h of the object to be heated. As the m-value thus determined represents the individual heating characteristic at each measuring point at each measuring location, the temperature profile by changing the heating condition may be simulated more effectively and more accurately, and verification by actually heating the sample circuit board may not necessarily be needed.

FIGS. 5(a)-5(e) show simulation result 1 performed according to the present embodiment by using the reflow furnace. FIG. 5(a) shows heating temperatures at each of the heating sections I-VII when the sample circuit board 1 is transferred in the reflow furnace 10 and heated. The temperature at each of the measuring points 3a-3c at each of the measuring locations is measured during this heating process. The required conditions for heating the object in this experiment are as follows:

(a) Targeted heating temperature and heating time (T2, t2): T2=220° C., and t2≧20 seconds (b) Required upper end temperature (Treq): 230° C.

(c) Maximum temperature (Tmax): 240° C.

(d) Allowable limited temperature and time (T1, t1):

T1=200° C., and t1≦40 seconds (e) Preheat temperature and time (T0, t0):

T0=160° C.-190° C., and t0=60 seconds-120 seconds (f) Temperature variation ($\Delta$t): <10° C.

The sample circuit board 1 is introduced into heating section I from the right side of FIG. 5(a), and then is transferred in the reflow furnace 10 by passing through each of the heating sections I to VII in this order. The first heating stage consisting of heating sections I to V is a preheat stage, and the second heating stage consisting of heating sections VI and VII is a reflow stage. In the example shown in the drawing, heating temperature at the preheat stage is set at 190° C. for all the heating sections I-V in the stage. This temperature is the upper end of allowable temperature range for preheating (T0). Heating temperature at the reflow stage is set at 240° C. for both of the heating sections VI and VII in the stage, which is equal to the maximum temperature (Tmax) of the required condition. Transfer speed v of the sample circuit board 1 is 1.25 m/minute. As is understood, transfer speed v may be used for analysis instead of heating time t in case the object is transferred at a constant speed. For example, when a length of a single measuring location is l, time t may be converted into transfer speed v by using an equation V=l/t.

The sample circuit board 1 is introduced into the reflow furnace 10 whose heating condition is thus arranged, and then surface temperature Ts at each of the measuring points of the sample circuit board 1 is measured at each of the measuring locations of the reflow furnace 10. Subsequently, m-values are calculated by using these measured temperatures Ts as well as the heating temperatures Ta and the heating time t (or transfer speed v, in this case) of the heating furnace 10, based on the Equation 8.

When all of the m-values for each of the measuring points of the object and measuring locations of the heating furnace are calculated, simulation may be performed. FIG. 5(b) shows a heating condition for simulation, in which the heating temperature in heating sections I, II and VI is changed, while transfer speed v is unchanged (v=1.25 m/min.). FIG. 5(c) shows results of the simulation under such a heating condition. These simulation results are obtained based on the Equation 7 by using the corresponding m-values calculated as described above.

In FIG. 5(c), only a part of the simulation results are shown including temperature variation Δt (item (f) of the required conditions listed above), maximum temperature Tmax (item (c) of the same), targeted heating time t2 over 220° C. (item (a) of the same), and allowable limited time t1 over 200° C. (item (d) of the same) for 3 measuring points (3a, 3b and 3b). All other simulation results corresponding to required conditions listed above may also be obtained, if necessary, by using a total of 700 surface temperatures Ts of each of the measuring locations for a single measuring point. For example, FIG. 5(c) shows simulation data at the reflow stage only, but data at the preheat stage (e.g., measured values at center location at the heating section III) are also available.

FIG. 5(d) shows verification results of the same items listed in FIG. 5(c) obtained by actually heating the sample circuit board 1 under the same heating condition as shown in FIG. 5(b). FIG. 5(e) shows differences between the simulation results shown in FIG. 5(c) and the verification results shown in FIG. 5(d). As is understood from FIG. 5(e), maximum temperature difference between the simulation and verification is 2.4° C. (228.1–225.7) at measuring point 3b, while maximum time difference is 2.4 seconds (28.0–25.6) at measuring point 3a. Considering the fact that a certain level of measuring variance caused by the reflow furnace and measuring device is unavoidable, such differences are quite small, and this can be evidence that simulation according to the present embodiment is very accurate.

The figures within circles in FIGS. 5(c) and 5(d) show that the peak temperature at the measuring point 3b did not meet the required upper end temperature (Treq=230° C.), which is necessary for transforming the solder into a completely liquefied phase. Accordingly, the simulation results (FIG. 5(c)) as well as the verification results (FIG. 5(d)) indicate that a further temperature increase and/or a transfer speed decrease at the reflow stage is required.

FIG. 6 shows another experimental simulation result 2 according to the present embodiment. Contents of the drawings in FIGS. 6(a)-6(e) are similar to those of FIGS. 5(a)-5(e), i.e., FIG. 6(a) shows a heating condition for heating the sample circuit board 1 to obtain m-values. Naturally, the temperature of each of the measuring points of the sample circuit board 1 would not go over the heating temperature of the heat source. Accordingly, at the first heating timing, it may be desirable to set the heating temperature of the preheat stage at the highest allowable temperature range of preheating T0 (190° C.) and similarly to set the heating temperature for the reflow stage at the maximum temperature Tmax (240° C.). As further condition changes may be done in only one direction, which is a direction to increase heating temperatures when such condition changes are required, such temperature setting procedure makes a work for selecting a subsequent heating condition for simulation easier. The transfer speed v for this heating is 0.8 m/minute. Required conditions for heating the object are the same as those in the previous experiment 1, except T2 and T1 are set at 200° C. and 180° C., respectively.

FIG. 6(b) shows a heating condition for simulation, in which transfer speed v is doubled (0.8→1.6 m/minute), while all other conditions are unchanged from the initial heating. When performing a simulation, this velocity change is practically implemented by changing heating time t in the Equation 7. Namely, when the transfer speed is doubled, heating time at each heating section I-VII becomes half.

FIG. 6(c) shows the results of simulation performed under the above modified heating condition, FIG. 6(d) shows results of verification by actually heating the sample circuit board 1 under the same heating condition, and FIG. 6(e) shows differences between FIGS. 6(c) and 6(d). As is clear from FIG. 6(e), maximum temperature difference between simulation and verification is 4.1° C. (214.9–210.8), and maximum time difference is 4.6 seconds (19.8–15.2). This may be considered as a marginal level in terms of simulation accuracy. In fact, this level of differences may be acceptable when compared to differences between a forecast made by a skilled operator and the results by actual heating.

It should be recognized, however, that the differences shown in FIG. 6(e) are relatively large when compared to the differences shown in FIG. 5(e). A possible reason for this is that a drastic condition change such as doubling transfer speed v in this case may deteriorate simulation accuracy due to heat interface developed when the sample circuit board 1 passes through the boundary between two adjacent heating sections at high speed. Therefore, in case of performing a simulation under a drastic condition change, such as doubling transfer speed, it may be desirable to re-calculate the m-values by actually heating the sample circuit board under such modified heating condition, and perform further simulation by using the re-calculated m-values.

Figure 7:
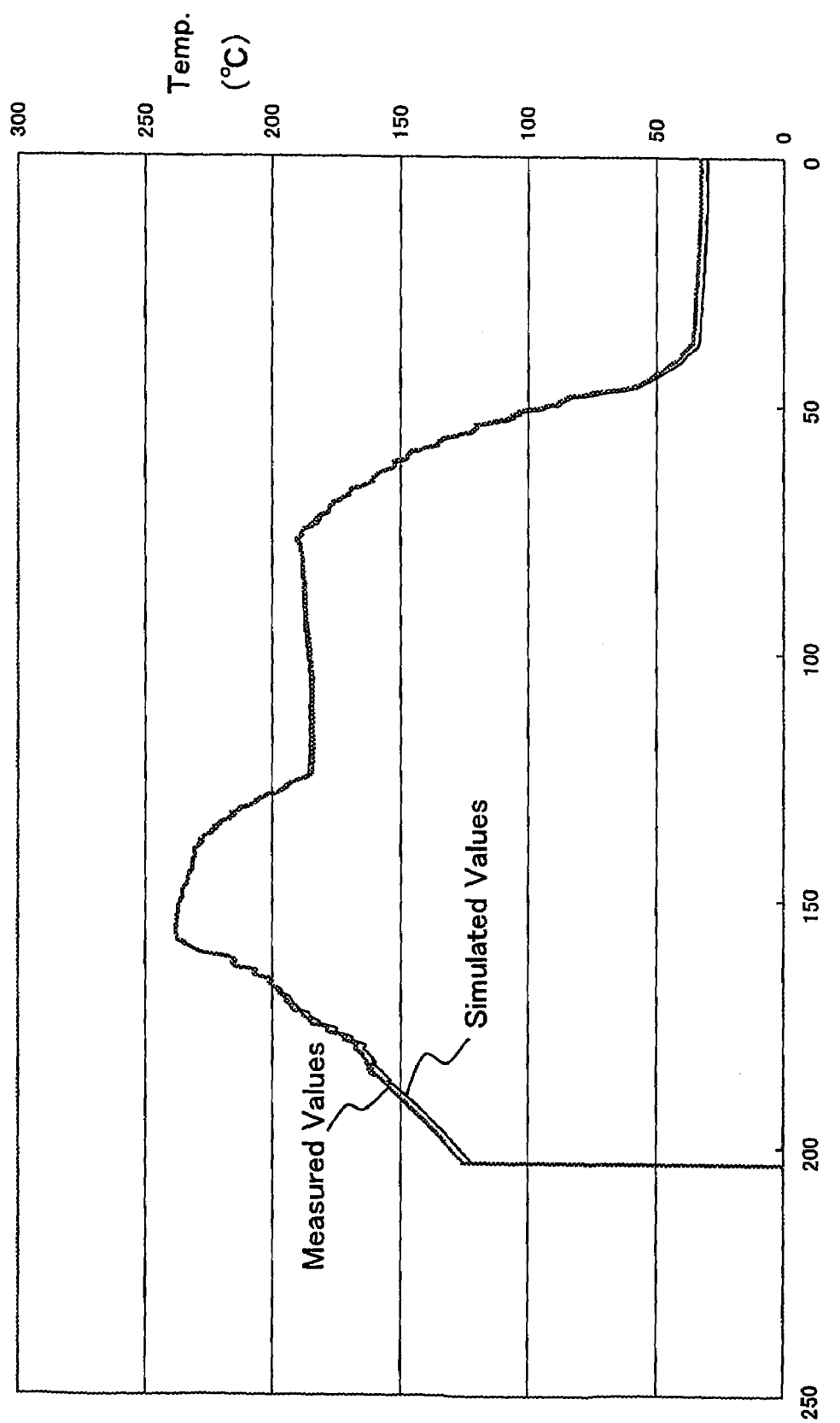
FIG. 7 illustrates a simulated temperature profile developed according to one embodiment of the present invention.

FIG. 7 shows two temperature profiles at measuring point 3a shown in FIGS. 5(c) and 5(d), one of which is a temperature profile of simulation results using m-values obtained according to the present invention, and the other is a temperature profile obtained by actually heating the sample circuit board at the verification step under the same heating condition. The vertical line represents temperature, and the horizontal line represents time (from right to left). The temperature profile of simulation results may be developed by plotting calculated surface temperatures obtained for 100 measuring locations for each heating section (total 700 locations for a single measuring point). As is clear from the drawing, the simulation results and verification results are almost identical, which is evidence that the simulation according to the present embodiment is very accurate. It is also understood from the drawing that almost perfect temperature profile may be developed when temperature simulation is made at a total of 700 locations for a reflow furnace.

Now, a method of thermal analysis using the above described simulation will be described hereinafter by referring to a flow chart shown in FIG. 8. This method of thermal analysis may be used for determining an appropriate heating condition of a heating furnace in a manufacturing line, such as a reflow heating line. First, at an m-value determining stage, a sample and heating condition of the heating furnace are determined at step #1. Such heating condition may include, but is not limited to, heating temperature and heating time (or transfer speed) of each heating section I-VII, measuring points of the sample circuit board, and measuring locations for each heating sections I-VII. At step #2, required conditions for heating the object are inputted. In this connection, it is desirable that the aforementioned required items (a)-(f) (T0, T1, T2, Tmax, Treq, ΔT, t0, t1, t2) are included, but it is also possible to include any other required conditions.

After such required conditions are determined, the sample circuit board 1 is introduced into the reflow furnace, and surface temperatures Ts (including the initial temperature Tint) of each of the measuring points are measured by using a temperature measuring device (such as a thermocouple) at step #3. Then, at step #4, the m-values, or heating characteristic values, for each of the measuring locations and measuring points are calculated by using the heating condition and the measured temperatures. The method of how to calculate the m-value is the same as already described above. It should be noted, as mentioned above, that physical characteristics of the heating object and/or the heating furnace are not required for calculating the m-values. Further, the m-values thus calculated are considered as a heating characteristic value which may represent all of the physical features of both heating furnace and the heating object.

After the m-values are calculated, the process goes into the simulation stage. At step #5, a heating condition for simulations are determined. At this step, heating temperature and heating time (or transfer speed) for each of the heating sections may be set at any desired level. In addition, as is described later, blowing speed of heated air may also be selected, if convection type of heating is used. At step #6, a temperature profile is developed based on simulation results using the corresponding m-values calculated at step #4. Although only one temperature profile for a single measuring point is illustrated in FIG. 7, similar temperature profiles for all other measuring points may also be developed. Based on all these temperature profiles, at step #7, whether or not the required conditions for the first heating stage are satisfied is checked. In the process shown in the flow chart, this first heating stage corresponds to a preheat stage. Namely, at this step #7, whether required conditions of temperature T0 and time t0 for preheating (in the example shown before, T0=150-190° C., t0=60-120 seconds) for all the measuring points are satisfied or not is checked.

If not all the measuring points satisfy the required conditions, the process goes back to step #5, and a heating condition for simulation, such as heating temperature is re-set. As described above, if heating temperature for the first heating stage (preheat stage) was set at the highest temperature in the allowable range (in the previous example, 190° C.), it should be understood that, when the required conditions are not satisfied, such failure is due to shortage of heating, because temperature of the heated object would not go over the heating temperature. Accordingly, when re-setting the heating condition of the first heating stage, condition change of either raising the heating temperature or lengthening the heating time (or decreasing transfer speed), or both of these is required. Generally, the heating condition required for the first heating stage, or preheat stage, is not so severe as those for the second heating stage, since the second heating stage is more important for achieving the ultimate goal of heating.

Next, at step #8, whether or not required conditions for the second heating stage are satisfied is checked. In case of reflow heating, a severe temperature control is required in this second heating stage so as to assure complete soldering of the electronic components, and at the same time to prevent any heat destruction of these components. Although two checking steps #7 and #8 for the first and second heating stages are shown in the flow chart, other checking steps, like third or forth heating stages, may also be added, if necessary. On the contrary, if only one heating stage is required, one of the checking steps #7 and #8 may be eliminated.

If the required conditions of the second heating stage are not satisfied at the checking step #8, the process goes back to step #5 and the heating condition for simulation is modified. For example, if the simulation results are the same as those shown in FIG. 5(c), the figure within a circle of required upper limit temperature (Treq) for measuring point 3b (228.1° C.) does not meet the required condition of 230° C. Accordingly, modifying the heating condition for the reflow stage by either raising heating temperature or lengthening heating time (or decreasing transfer speed) is required at step #5 in order to meet such required conditions. As can be seen in FIG. 1, since a variety of required conditions are given like a network in this reflow stage, all these factors need to be considered when re-setting the heating condition for simulation.

In this connection, in a prior art, after a sample circuit board is heated, a skilled operator determines the subsequent heating condition for the subsequent heating trial based on the preceding results, and such procedure is repeated. On the contrary, according to the present embodiment, once the m-values are calculated, simulations may be performed merely by paper work by using the m-values. Therefore, even if a subsequent heating condition is set at a somewhat random basis, such repeated simulation works do not take a long time. As an example, assuming 10 times of repeated simulations are required by changing the heating condition each time, it normally takes about 5 hours to complete the conventional works including waiting times for making the heating furnace in a stable condition after one trial of heating is completed. According to the simulation of the present embodiment, such simulation works may be completed in about an hour. It is apparent that such simulations may be completed even more effectively when a computer is used, which will be described later.

If all the required conditions for reflow stage are satisfied at step #8, the appropriate heating condition is determined at step #11 as shown by a dotted line. Steps #9 and #10 are verification steps for confirming whether the heating condition determined through such simulation works actually satisfy the required conditions or not by actually heating a sample object. These steps #9 and #10 are optional, and as far as accuracy of the simulation works according to the present embodiment is assured, these steps may be eliminated. If results of the verification steps #9 and #10 show that required conditions are not satisfied, the process may go back to step #4, and m-values are re-calculated based on the results of the verification steps, and simulation steps are repeated. By such repetitions of simulation works by changing the heating condition, more accurate temperature simulation results may be obtained.

FIG. 9 shows the experiment 3 which includes steps of: heating a sample circuit board and obtaining m-values; performing a simulation by using the m-values; verifying simulation results by actually heating the sample circuit board under the same heating condition as the simulation; re-calculating m-values based on the data obtained at such verification process; and performing another simulation using the re-calculated m-values. FIG. 9(a) shows an initial heating condition for each of the heating sections I-VII for heating the sample circuit board. The initial m-values are calculated based on such heating results. FIG. 9(b) shows a heating condition selected for performing a first simulation, and FIG. 9(c) shows some outcomes of resultant temperatures and times obtained by the first simulation. FIG. 9(d) shows corresponding verification results through actually heating the sample circuit board under the same heating condition as shown in FIG. 9(b), and FIG. 9(e) shows differences between the simulation results (FIG. 9(c)) and the verification results (FIG. 9(d)).

According to FIG. 9(e), maximum temperature difference is 3.4° C. (239.4–236.0), and maximum time difference is 3.3 seconds (240.1–236.8), which are acceptable levels of accuracy, although not so accurate when compared to other results such as those shown in FIG. 5(e), for example. The possible reason for this is that, in addition to temperature changes of the heating sections I, II, VI and VII, transfer speed of the heating object is also considerably increased (from 0.8 to 1.35 m/minute). Especially, figures within circles in FIG. 9(d), which are t1 for measuring point 3a (41.4 seconds, compared to required <40 seconds), and Tmax for the measuring point 3c (240.1° C., compared to required <240° C.) are out of the allowable range, which are not seen for the case of simulation results shown in FIG. 9(c).

Accordingly, second simulation under the heating condition shown in FIG. 9(f) is performed by using the corresponding re-calculated m-values for each of the measuring locations and measuring points obtained from verification results by actually heating the sample circuit board (FIG. 9(d)). In this second simulation, heating temperatures for the heating sections I-V and VII are lowered, while heating temperature for the heating section VI is raised in an intention to meet t1 and Tmax conditions of the measuring point 3c and 3a, respectively, which have failed at the previous heating process. The newly obtained simulation results, as shown in FIG. 9(g), meet all the required conditions for each of the measuring points 3a-3c.

FIG. 9(h) shows verification results achieved by actually heating the sample circuit board under the same heating conditions as shown in FIG. 9(f). As is clear from FIG. 9(h), the resultant profile satisfies all the required conditions, including t1 and Tmax, which failed to have been met at the previous verification step shown in FIG. 9(d). FIG. 9(i) shows differences between the simulation results shown in FIG. 9(g) and verification results shown in FIG. 9(h). As is apparent from FIG. 9(i), maximum temperature difference between the two is 1.0° C. (38.8–37.8) and maximum time difference is 1.0 second (231.3–230.3), which are far smaller than those of the first simulation results shown in FIG. 9(e). As is understood from the above, by repeating steps of calculating m-values and performing simulations, simulation accuracy is improved gradually. This is because the heating condition for simulation comes close step by step to the aimed heating condition which may satisfy all the required conditions.

It may happen in some occasions that, on one hand the temperature of one of the measuring points of the heating object goes over the maximum temperature Tmax (240° C.), while on the other hand the temperature of one of the other measuring points of the same object may not achieve the required upper end temperature Treq (230° C.) (i.e., large temperature variance exists among the measuring points). It may be possible to find out solutions even in such an extreme case by, for example, adjusting transfer speed v (or heating time t) of the heating object, but sometimes it may become impossible to determine an appropriate heating condition especially when an allowable range of the condition is very narrow. According to the present invention, such a critical situation may be identified within a short period of time by repeating simulations, which makes it possible to judge, at an earlier timing, that determining an appropriate heating condition is impossible. In case of prior art, trial and error procedures are to be continued even in such cases, which causes time loss of the total operation.

When temperature variance among the measuring points (ΔT) is extremely large, it may be considered that some problems and/or changes of physical conditions of the heating furnace may exist, such as the heated air blow does not reach to an inner wall side of the furnace, or the heated air blow is blocked locally for some reasons. According to the present invention, these kinds of problems of the heating furnace may be foreseeable by periodically obtaining the m-values of the specific heating furnace, and monitoring trends of the m-values. In addition, when a plurality of heating furnaces are used, m-values for each of the furnaces may be obtained by heating the same sample under the same heating conditions. By comparing these m-values among each other, differences of physical characteristics of these furnaces may be identified, and problems of a specific furnace may be identified based on such comparison. Accordingly, the m-values according to the present embodiment may also be used for the purpose of preventive maintenance and management of heating furnaces.

Furthermore, when differences of physical characteristics among a plurality of equipment are identified, such differences may be used for controlling a plurality of equipment as a whole. For example, once m-values are obtained by using a specific furnace A, simulation for another furnace B may be performed without actually obtaining individual m-values for this particular furnace B, because such m-values for the furnace B may easily be identified by adjusting the m-values of the furnace A by using previously identified differences among the two.

The method of thermal analysis according to the present embodiment described above may be applicable even in a wider scope. One example of which is conducting a simulation by changing blowing speed of the heated air at one or more of the heating sections I-VII. In the above described embodiment, blowing speed of the heated air is assumed to be constant (e.g., 5 m/second). It is known, however, that heat transfer of the object may vary when blowing speed of the heated air is changed even when heating temperature is the same. Such kind of relations between heat transfer and blowing speed may be obtained by experiment, or even statistic data are available for some cases.

Figure 10:
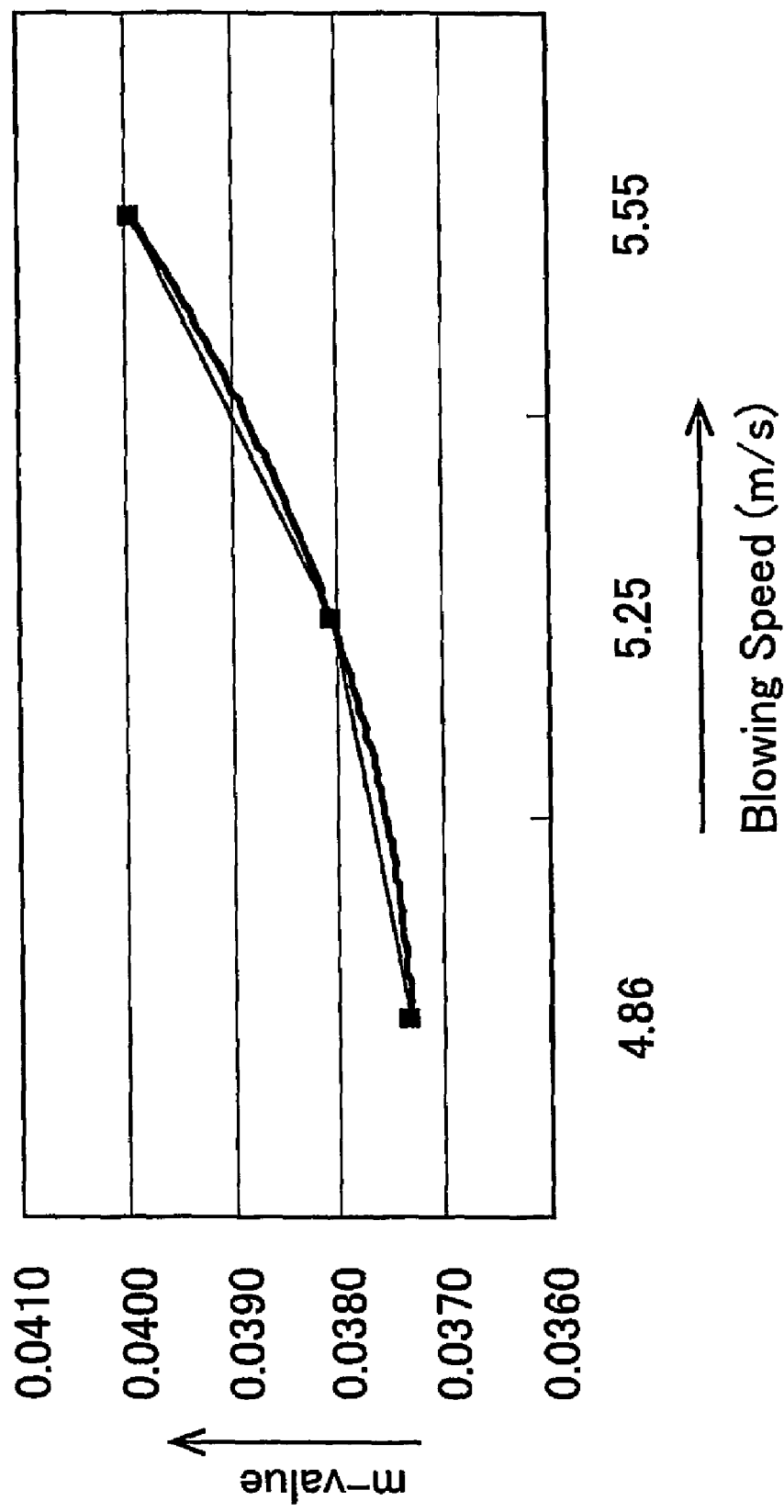
FIG. 10 shows the result of an experiment for identifying relations between blowing speed of heated air and the heating characteristic value.

One example is shown in FIG. 10, which shows relations between blowing speed of the heated air and heating characteristic value, or m-value, obtained by experiments conducted by the present inventors. In the drawing, the horizontal line represents blowing speed of the heated air (m/second), and the vertical line represents m-value. According to the experiment results, such relations are approximately represented by the following equation when the vertical line is the y axis, and the horizontal line is the x axis:

$$y = 0.0006x^2 - 0.0009x + 0.0377 \quad (9)$$

By obtaining such relations beforehand, simulations including changing blowing speed of heated air may be conducted by adjusting m-values according to Equation 9. Other simulation procedures are the same as those described above.

In the above described embodiment, the object is heated by convection type of heating. Another possible application of the m-value according to the present invention is to the radiation type heating, such as heating the object by infrared radiation. As explained before by using Equation 3, temperature change ΔT of the heating object during the time Δt is shown by the equation:

$$\frac{\Delta T}{\Delta t} = \frac{hS}{\rho CV}(Ta - Ts) + \frac{\alpha \varepsilon FS}{\rho CV}(Th^4 - Ts^4)$$

The former half of the right side of the equation is an element of convection type heating and the latter half is an element of radiation type heating. The latter half was eliminated for the case of convection type heating as shown in Equation 4, since effect by radiation type heating is almost negligible for convection type heating. In a similar manner, for the case of radiation type heating, the former half of the right side of the equation may be eliminated as follows:

$$\frac{\Delta T}{\Delta t} = \frac{\alpha \varepsilon FS}{\rho CV}(Th^4 - Ts^4) \quad (10)$$

By replacing the Equation 4 with the Equation 10, heating characteristics, or m-values for the case of radiation type heating may be calculated. The rest of the simulation procedures are similar to those described above, hence a variety of simulations may be performed by using such m-values even for the case of radiation type heating.

Another possible application of the heating characteristics according to the present invention is to the case of cooling an object. In the heating furnace shown in FIG. 1, a cooling device 11 is provided at the exit of the heating furnace 10. When it is required not to leave the object (such as the case of a circuit board) at a high temperature for a long period of time, air or cooled air may be blown to the object for cooling the object rapidly. Even in such a cooling operation, in a similar manner as described above, m-values for cooling process may be calculated by cooling a sample object under a predetermined cooling condition with known temperature of cooling air and cooling time, and by measuring the temperature of each of the measuring points of the object. The rest of the procedures for performing temperature simulation is similar to those described above.

Such m-values representing heating characteristics (i.e., cooling characteristics, in this case) of both the cooling equipment and the object to be cooled may also be applicable to thermal analysis for purely a cooling process. For example, m-values may be applied to a cooling process having a temperature profile completely upside down relative to the profile shown in FIG. 1, with the initial temperature Tr being an axis of contrast. Namely, m-values may be calculated by cooling the sample in the cooling equipment under a predetermined cooling temperature and cooling time (or transfer speed of the object), and by measuring temperatures of at least one measuring point of the cooling object at each of at least one measuring location of the cooling equipment. Simulation for developing a temperature profile may be performed by using these m-values. It is also possible to determine an appropriate cooling condition which may satisfy a required temperature profile of the cooling object.

When applying the method of the present invention for such a cooling process, it should be understood that some terminologies in the above description need to be replaced with corresponding cooling terminologies, such as replacing "heating" with "cooling", "heated air" with "cooled air", "preheat" with "pre-cool", "upper" or "raise" of temperature with "lower" etc. Instead of heated air or infrared radiation for heating, cooled air or freezer panel may be used as a cooling source. Therefore, in this specification, the term "heat" should include not only normal interpretation of heat, but also meaning "minus heating", i.e., cooling, unless otherwise specifically defined.

The heating furnace shown in FIG. 1 transfers the object through the furnace 10 by using a transfer device 8. The present embodiment may be applied to other types of heating furnaces, such as a furnace without having a transfer device, for example. In such a heating furnace, the object is placed inside the furnace and heated in accordance with a desired temperature profile by changing heating temperature inside the furnace at certain time intervals without being moved inside the heating furnace. Accordingly, the heating sections I-VII structured in the heating furnace 10 shown in FIG. 1 are not necessarily required to have physically separated heating areas, but rather the heating sections should include a case of a single heating chamber (or area) which may heat an object at a variety of temperature conditions for certain time intervals inside the same chamber.

The second embodiment of the present invention will be described hereinafter. This embodiment relates to a program or a computer readable recording medium recording such a program, both of which may be used for performing the aforementioned thermal analysis by using a computer.

The program and the computer readable medium of the present embodiment basically include processing steps for implementing the thermal analysis described in the previous embodiment. Namely, the program of the present embodiment is configured to make a computer process the steps of:

heating a sample object under a certain heating condition (heating temperature and heating time) and measuring temperatures of the object, thereby calculating m-values, or heating characteristic values, using such measurement results based on the Equation 8, or otherwise receiving input of such m-value data obtained by a similar manner outside of the computer;

determining the object, such as a circuit board, and determining a heating condition for simulation;

simulating a temperature profile by calculating temperatures for each of the measuring points of the circuit board by using the heating condition for simulation and obtained m-values;

checking whether or not the heating condition for the simulation satisfies a required temperature profile by comparing the simulation results with the required conditions for heating;

if the required conditions for heating are not satisfied, modifying the heating condition for the subsequent simulation based on the preceding checking process, and performing a simulation, again;

if the required conditions for heating are satisfied, making a judgment that the heating condition is appropriate for satisfying the required condition for heating; and optionally, if the above steps are repeated in a closed loop over a predetermined time, making a judgment that determining appropriate heating condition to satisfy the required conditions for heating is impossible.

The steps listed above are basically the same as those described in the previous embodiment. Although, certain algorithms are to be included in the program so that computer may modify and determine a heating condition for the subsequent simulation by itself. The following describe such an algorithm for the case of reflow heating having the first heating stage (i.e., preheat stage) and the second heating stage (i.e., reflow stage), although the algorithm may be applicable to other types of thermal analysis in a similar manner.

The following description is made under the assumption that the required conditions for heating the object are the same as the previous embodiment, which are as follows:

(a) Targeted heat temperature and heating time (T2, t2):
T2=220° C., and t2≧20 seconds
(b) Required upper end temperature (Treq): 230° C.
(c) Maximum temperature (Tmax): 240° C.
(d) Allowable limited temperature and time (T1, t1):
T1=200° C., and t1≦40 seconds
(e) Preheat temperature and time (T0, t0):
T0=160° C.-190° C., and t0=60-120 seconds These specific required conditions may be shown in some occasions in blocks in the following description.

Although item (f) (temperature variance: ΔT) is not included for simplicity in this case, such condition, or any other required conditions may be added, if necessary.

Figure 8:
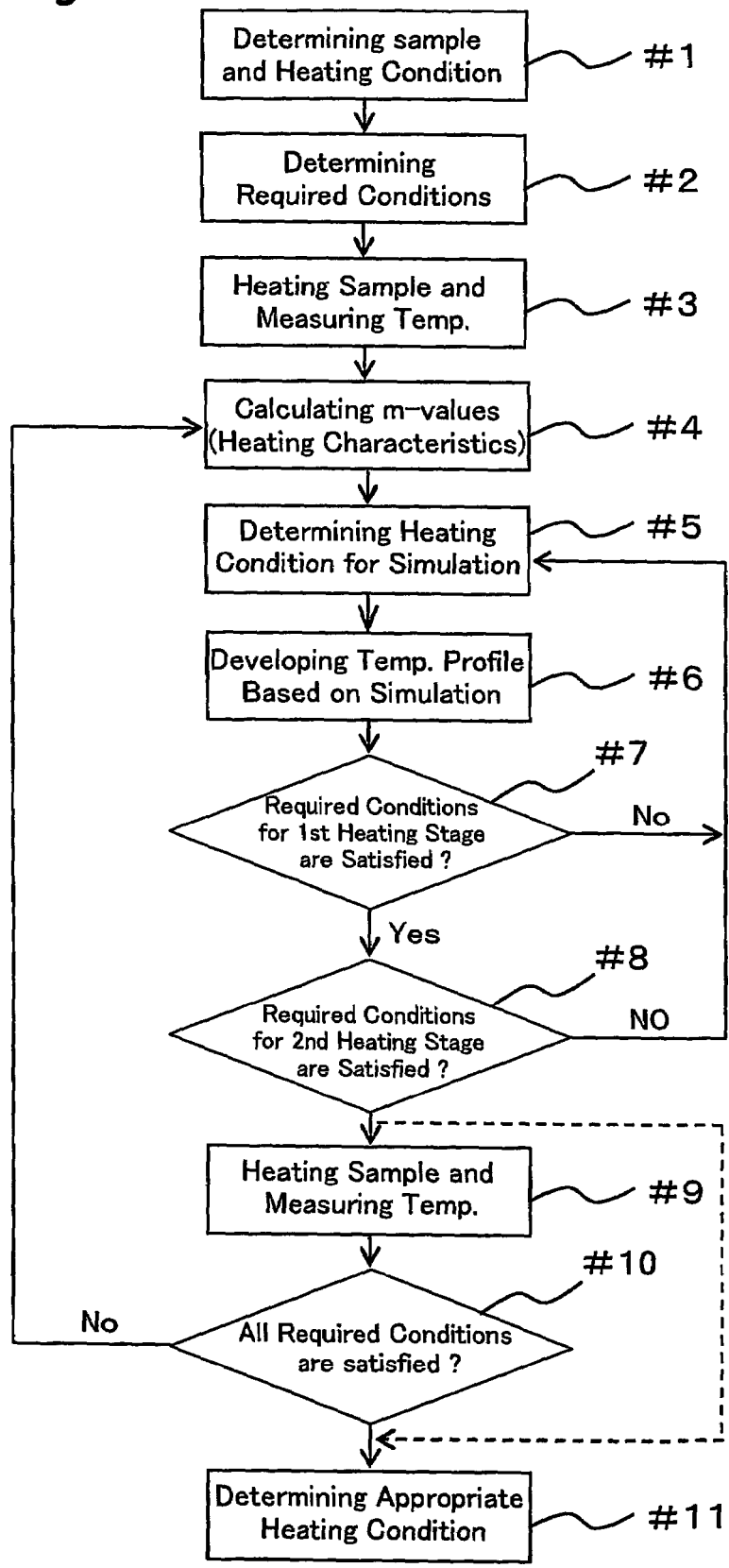
FIG. 8 is a flow chart of a method of thermal analysis according to another embodiment of the present invention.
Figure 11:
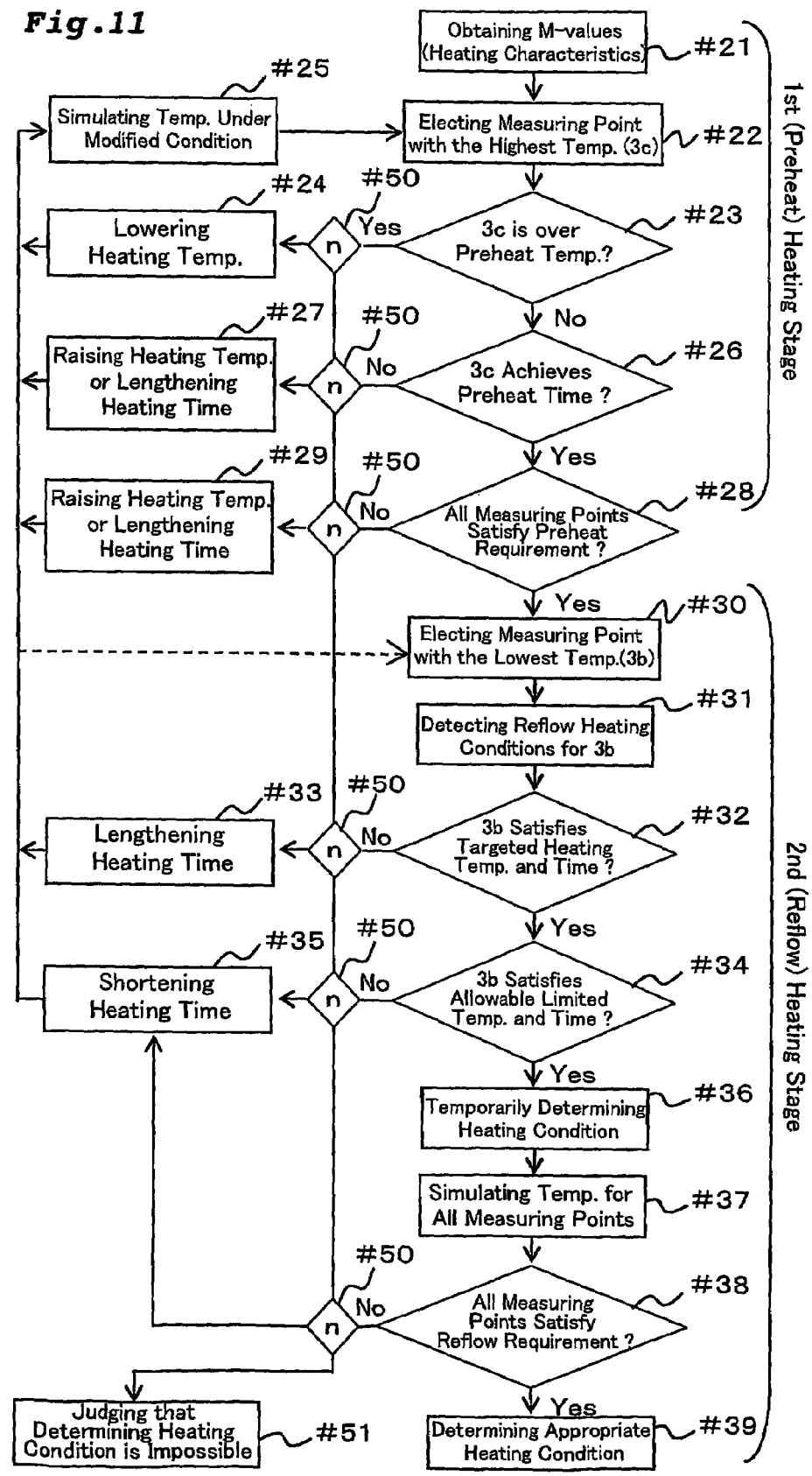
FIG. 11 is a flow chart showing steps of a program according to another embodiment of the present invention, FIG. 12 schematically shows a logic of modifying the heating condition used for the first heating stage of the flowchart shown in FIG. 11.

Referring to FIG. 8, the sample circuit board is heated at step #3, and m-values are calculated by using measured temperatures at step #4. A heating condition for simulation is determined at step #5, and through such simulation, whether or not such a heating condition satisfies required conditions is checked at steps #7 and #8. FIG. 11 shows steps including an algorithm that the computer may perform to determine an appropriate heating condition for simulation by itself during the process.

In FIG. 11, heating characteristic values (i.e., m-values) are obtained at step #21. Such value may be calculated through steps #1-#4 shown in FIG. 8 for each of a plurality of measuring points and measuring locations. Based on either actual heating of the circuit board or the results of the simulation, the measuring point which has achieved the highest temperature at the first heating stage is elected at step #22 (in case of the example shown in FIG. 4, measuring point 3c is to be elected). This is for confirming at step #23 whether or not temperature of any of the measuring points goes over the allowable temperature range for the preheat stage, by electing and checking the measuring point 3c with the highest temperature at the preheat stage (confirmation step A). If the measuring point 3c is out of the allowable temperature range, this means that the measuring point 3c is over the upper end of the allowable range (190° C.). In such a case, the heating condition is modified by lowering temperature based on a predetermined rule at step #24, and simulation is performed again at step #25, then the process goes back to step #22 to repeat the procedures described so far.

One of the possible predetermined rules to lower the heating temperature at step #24 is to lower the heating temperature down to the upper end temperature of the allowable range at the preheat stage (190° C.). This is because each measuring point would not be heated beyond the allowable range, as far as the heating temperature is set at the upper end level of the allowable range. Other possible rules to lower the heating temperature may be to identify a temperature difference between the measured or calculated temperature and the upper end temperature of the allowable range (190° C.) and to lower the heating temperature by the amount of such temperature difference, or by the amount obtained by multiplying a certain ratio to such temperature difference. By inputting such predetermined rules to the computer beforehand, the computer can make a proper adjustment for setting the heating condition for subsequent simulation by itself at step #24.

Although not shown in the drawing, if the elected measuring point which has achieved the highest temperature at step #22 does not meet the lower end temperature of the allowable range (160° C.), it is, of course, required to modify the heating condition by raising the temperature at step #24, and to perform a simulation again at step #25. The process then goes back to step #22 to repeat the aforementioned procedures. In general, however, a heating condition with a heating temperature lower than the lowest level of the allowable range may not be selected when considering the fact that the temperature of the object to be heated would not go over the heating temperature. Accordingly, this adjustment is considered to be a relieving remedy for exceptional cases. Possible rules to be provided to the computer beforehand for raising the heating temperature in such a case may be determined in a similar manner to the case for lowering the temperature as mentioned above (although adjustment direction is opposite).

If the temperature of the measuring point 3c satisfies the allowable range of the required conditions at step #23, then whether or not required preheating time (60-120 seconds) is satisfied is checked at step #26 (confirmation step B). If this requirement is not satisfied, the heating condition is modified either by raising the heating temperature or by increasing the heating time (or lowering the transfer speed) based on a predetermined rule at step #27 in an intention that the temperature of the object goes up to the required temperature (190° C.) at an earlier timing in the preheat stage.

Figure 12:
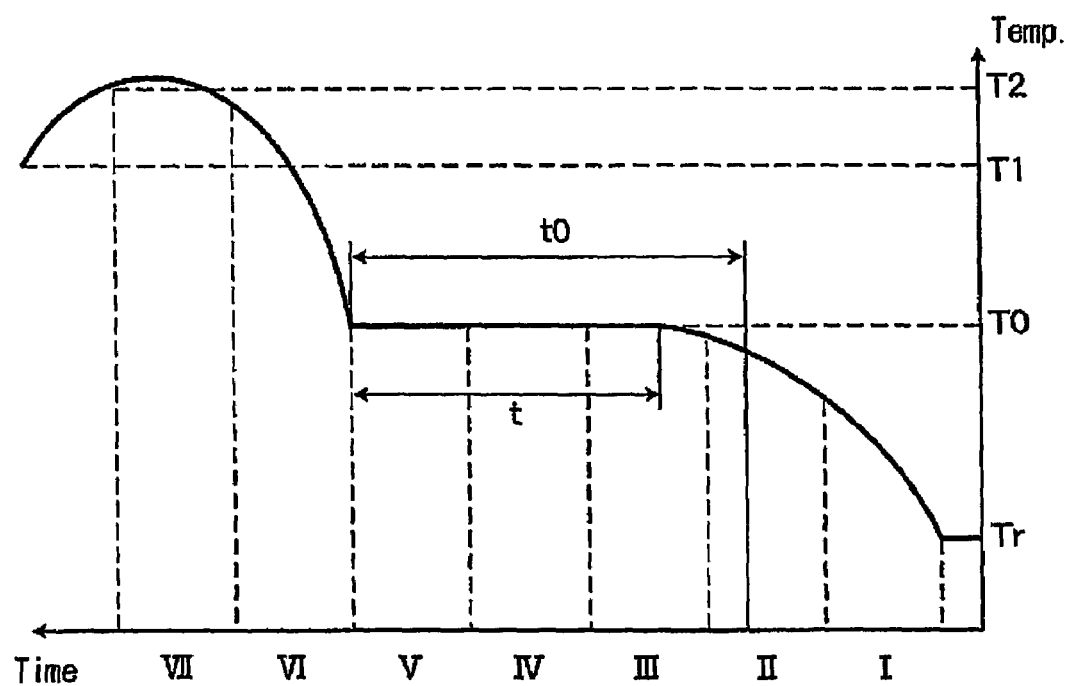

FIG. 12 shows one of the possible predetermined rules to raise the heating temperature at step #27. The drawing shows a temperature profile of the measuring point 3c (or the object), wherein vertical and horizontal lines represent temperature and time (from right to left), respectively. The time in the horizontal line is shown by the sequence of the heating sections I-VII. The object introduced into the heating furnace at temperature Tr is heated gradually while the object is transferred in heating sections from 1 to V of the preheat stage, and reaches the required range of preheat temperature T0 (160-190° C.) in the middle of the heating section III in the shown case. The object is kept at that preheat temperature level for time t. If this time t falls short of the required range of preheat time t0 (60 seconds), i.e., if t<t0, temperature adjustment is made at heating sections I and II (i.e., any heating sections located in advance of the section III where the object first reaches the required temperature T0) by raising respective temperatures by, for example, 1° C.

Simulation is performed based on the modified heating condition, and if the time t does not meet the required time t0 again, then the heating temperature of these heating sections I and II are adjusted one more time by, for example, 1° C. This procedure is repeated until the time t achieves the required time t0. Temperature adjustment by every 1° C. is just an example, and this may be bigger or smaller than 1° C.

Still referring to FIG. 12, one possible predetermined rule to increase the heating time at step #27 is to multiply a ratio of the required time t0 versus the calculated or measured time t (t/t0, <1) to the preceding transfer speed of the object, or to divide the preceding heating time by the same ratio. It may be determined beforehand whether adjusting at step #27 is to be made by raising the heating temperature or by lengthening the heating time, or by both of these.

Although not shown in FIGS. 11 and 12, if the calculated or measured time t is over the required range of preheating time t0, i.e., if t>120 seconds, the adjustment of the heating condition may be done in a similar manner, but adjusting direction is opposite. Namely, the heating condition is modified either by lowering the heating temperature by a predetermined amount for any heating sections located in advance of the heating section where the object reaches the required range of preheating temperature T0, or by shortening the heating time at the preheat stage based on predetermined rules, or by both of these based on a predetermined rule. Such predetermined rule for lowering the heating temperature or shortening the heating time may be similar to the above description, although the direction is opposite. Modifying the heating condition in such an opposite direction may not be required in an ordinary situation, since the required conditions at the preheat stage are not so severe. Therefore, such an adjustment is considered to be a relieving remedy for exceptional cases.

If measuring point 3c which has achieved the highest temperature at the preheat stage could meet the required conditions at step #26 in FIG. 11, it is confirmed at step #28 whether or not rest of the measuring points 3a and 3b also satisfy all the required conditions of temperature and time of preheat stage (confirmation step C). Since the measuring point 3c with highest achieving temperature has already met these conditions, the only possible failure for meeting the requirement by the other measuring points should be shortage of heating. Accordingly, if any measuring points fail to meet such required conditions, the heating condition is modified at step #29 either by lengthening the heating time (or decreasing transfer speed) or by raising heating temperature, or by both of them based on a predetermined rule, and the process returns to step #25 to repeat the procedures described above. A possible predetermined rule for lengthening heating time at step #29 is to multiply preceding transfer speed with a ratio closest to 1 among the ratios of the required time t0 (60 seconds) versus calculated or measured time t (t/to, <1) for each measuring point, or to divide the preceding heating time by the same ratio. A possible predetermined rule for raising heating temperature at step #29 is to identify temperature differences between the measured or calculated temperatures and the lower end temperature of the allowable range (160° C.) for all the measuring points which failed to meet the required temperature ranges and to raise the heating temperature by the amount same as the smallest temperature difference among all of the failed measuring points, or by the amount obtained by multiplying a certain ratio to the smallest temperature difference. Such adjustment rules may be inputted to the computer beforehand.

After it is confirmed that all the measuring points have met the required conditions for the first heating (preheat) stage at step #28 in FIG. 11, the process goes into the second heating stage, where more severe temperature control is required. For simplifying the case, it is assumed here that the figures shown in FIG. 5(c) are obtained as a result of a simulation (or actual heating) for three measuring points $3a$-$3c$. At step #30 in FIG. 11, one measuring point which has achieved the lowest temperature in the reflow stage during such simulation or actual heating among all the measuring points is selected. The reason why the measuring point with the lowest temperature is selected is that, at this reflow stage for soldering, all the measuring points, including the point with the lowest temperature, should achieve the required upper end temperature (Treq: 230° C.) anyway in order to make the solder on the circuit board to be transformed into a completely liquefied phase. In the example shown in FIG. 5(c), the measuring point $3b$ (peak temperature of which is 228.1° C. as shown within a circle) is to be selected at step #30 (hereinafter, referred to "lower critical measuring point $3b$").

When the lower critical measuring point $3b$ fails to meet the require upper end temperature Treq (230° C.) as shown in this case, modification of the heating condition by raising the heating temperature is required. In this connection, care should be taken that the temperature of the other measuring point which has achieved the highest temperature during the heating or the simulation in the reflow stage (in the example shown in FIG. 5(c), the measuring point $3c$) is also raised by such an adjustment, and that this temperature raise should not make the measuring point $3c$ to go over the maximum temperature Tmax (240° C.). For this reason, temperature raise of this particular measuring point (measuring point $3c$, in this case) should also be watched carefully (hereinafter, referred to as "upper critical measuring point $3c$"). The rest of the measuring points (only measuring point $3a$, in this case), excluding the lower and the upper critical measuring points $3b$ and $3c$, may be assumed that their temperature profiles are located (or sandwiched) between the lower and the upper critical measuring points throughout the heating process described hereinafter.

At step #31 of FIG. 11, at least one heating condition which may make the lower critical measuring point $3b$ to meet the required conditions for the reflow stage (the second heating stage) is detected by simulation. For this detecting purpose, an algorithm using the maximum temperature Tmax (240° C.) and the required upper end temperature Treq (230° C.) may be used, which is described hereinafter. FIG. 13(a) illustrates the outline of the algorithm, in which the vertical line represents a temperature of the lower critical measuring point $3b$ and the horizontal line represents time. In the drawing, 2 heating sections VI, VII are structured in the reflow stage, similar to the heating furnace shown in FIG. 1. The object to be heated is transferred from right to left, i.e., in the order of heating sections V, VI and VII, as time goes by.

In FIG. 13(a), the lower critical measuring point $3b$ which was heated up to the preheat temperature T0 through heating sections I-V of the preheat stage is introduced into the initial heating section VI of the reflow stage. The lower critical measuring point $3b$ is then heated in the heating sections VI and VII in this order. Zone X with slanted lines denotes an area where a temperature profile of the lower critical measuring point $3b$ should be located when it is heated in the heating sections VI and VII. The upper boundary of the zone X is defined by two lines, one of which is a temperature increase line between a point H of preheating temperature T0 at the begging of heating section VI and a point E of the maximum temperature Tmax at the end of the heating section VI, and the other line is between the point E at the end of heating section VI (or the beginning of heating section VII) and a point G of Tmax at the end of the heating section VII. The lower boundary of the zone X is defined by a line between the point H of preheating temperature T0 at the beginning of the heating section VI and a point F of required upper end temperature Treq at the end of the heating section VII.

As long as the temperature profile of the lower critical measuring point $3b$ is located in the zone X, the point $3b$ satisfied at least two of the required conditions of the reflow stage, namely, the temperature of the measuring point $3b$ would not go over the maximum temperature Tmax nor go below the required upper end temperature Treq. Although the zone X shown in the drawing is defined by all straight lines between H and E, and H and F, such lines may be concave or convex, or other curved lines, or a combination thereof, as far as the temperature profile of the measuring point $3b$ does not go over the maximum temperature Tmax.

The heating condition at heating sections VI and VII may be determined so as to locate the temperature profile of the lower critical measuring point $3b$ inside the zone X through simulation by using the m-values. More specifically, the heating temperatures of both of the heating sections VI and VII may be raised from the preheat temperature T0 (19° C.) up to an given upper limit temperature physically defined by the heating furnace (for example, 300° C.) irrespective to each other. Simulations are repeatedly performed by raising the temperature of each of the heating sections VI and VII independently by every 2° C., for example, from the lowest temperature (190° C.) to the highest temperature (300° C.) in the predetermined range. For all of the combinations of such respective temperature changes of the heating sections VI and VII, corresponding temperature profiles of the lower critical measuring point $3b$ may be obtained through simulation by using the m-values. Among such combinations of temperature changes, any of the temperature combinations of the heating sections VI and VII which may locate the temperature profile of the lower critical measuring point $3b$ inside the zone X are detected. Temperature raise by every 2° C. is just an example, and this step of temperature raise may be larger, like every 4° C., or smaller, like every 1° C.

There may be some other heating furnace structures, in which, for example, the second heating stage has only one heating section VI, or more than two heating sections VI, VII, VIII . . . , etc. FIGS. 13(b) and 13(c) show examples of defining zone X in such cases. If the reflow heating stage has only one heating section VI, one possible way to detect heating condition at the heating section VI is, for example, to perform a simulation by changing the heating temperature at the heating section VI by every 2° C., and identify heating condition(s) which may locate the temperature profile of the lower critical measuring point $3b$ inside the zone X shown in FIG. 3(b). If the reflow heating stage has 3 (or more) heating sections, the zone X may be defined by 3 lines, as shown in FIG. 13(c), consist of: a line between a point H of temperature T0 at the beginning of the initial heating section VI and a point E of maximum temperature Tmax at the end of the same heating section VI; a line between the point E and a point G of maximum temperature Tmax at the end of the last heating section (section VIII, in this example); and a line between the point H and a point F of the required upper end temperature Treq at the end of the last heating section (section VIII, in this case). Simulations are then repeatedly performed for all possible combinations by changing temperature by every 2° C. for each of the heating sections independently. Those zone X shown FIGS. 13(a)-13(c) are only examples, and other kind of zone may be defined. Lines between H and E, and H and F may not necessarily be straight lines, as described above.

Figure 14:
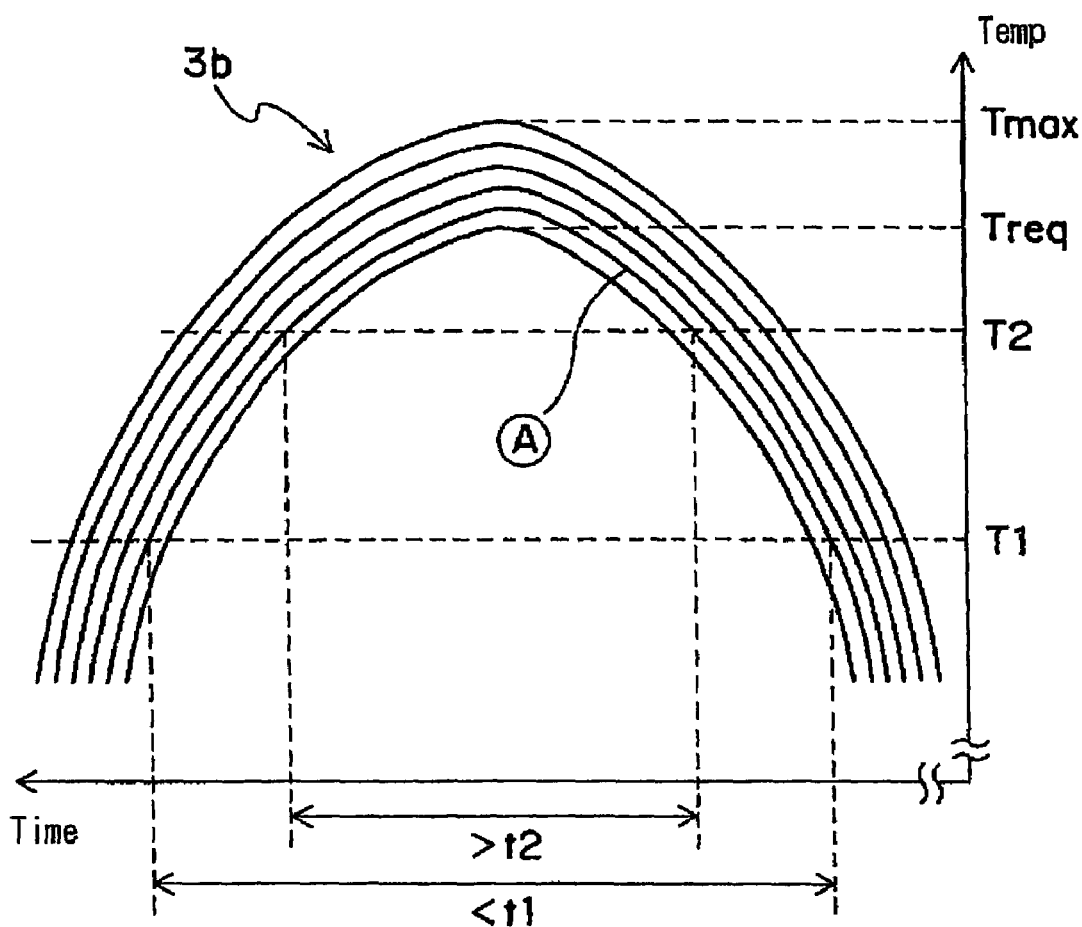

FIG. 14 shows some of the temperature profiles of the lower critical measuring point 3b detected through simulations by changing a combination of heating temperatures of the heating section(s) as described above. FIG. 14 shows temperature profiles at the reflow stage only (profiles at the preheat stage are not shown). In the example shown in FIG. 14, 6 heating conditions (or 6 combinations of heating temperatures at heating sections VI and VII) corresponding to 6 temperature profiles shown in the drawing could satisfactorily locate these individual profiles inside the zone X. Each of these 6 profiles have met temperature requirements, i.e., peaks of these profiles are lower that the maximum temperature Tmax and higher than the required upper end temperature Treq. Also, for each of the 6 profiles, corresponding heating temperature combination of the heating sections VI and VII is identified on a one by one basis.

Now back to FIG. 11, it is confirmed at step #32 whether or not each of the detected profiles of the lower critical measuring point 3b satisfy other required conditions, i.e., targeted heating temperature T2 and time t2 (equal to or more than 20 seconds over 220° C.) (confirmation step D). If none of the identified profiles can meet such requirements, it means that heating was not sufficient, and the process goes to step #33 where the heating condition is modified by lengthening heating time (or reducing transfer speed) based on a predetermined rule, and then the process goes back to step #25 to repeat the procedures described above.

One possible example of the predetermined rule for lengthening heating time at step #33 is to multiply preceding transfer speed with a ratio closest to 1 among the ratios of the required time t2 (20 seconds) versus simulated or measured time t (t/t2, <1) for all the identified temperature profiles, or divide the preceding heating time by the same ratio.

If at least one of the identified temperature profiles of the lower critical measuring point 3b meets such requirement at step #32, it is confirmed next at step #34 whether or not such temperature profile(s) satisfy another heating condition at the reflow stage, i.e., allowable limited temperature T1 and time t1 (equal to or less than 40 seconds over 200° C.) (confirmation step E). If none of the selected temperature profiles could meet such the requirement, this means that the object is overheated. In this case, the heating condition is modified by shortening the heating time (or increasing transfer speed) based on a predetermined rule, and then the process goes back to step #25 to repeat the procedures described above. One possible example of the predetermined rule in this case is to multiply precedent transfer speed with a ratio closest to 1 among ratios of the allowable limited time t1 versus simulated or measured time t (t/t1, >1) for all the detected temperature profiles, or divide the precedent heating time by the same ratio.

If at least one of the identified temperature profiles of the lower critical measuring points 3b have met such requirement at step #34, one of the profiles which has met the targeted heating time t2 (equal to or more than 20 seconds) by the smallest time difference (or closest to 20 seconds) is selected (in a example shown in FIG. 14, profile A is to be selected). The lower critical measuring point 3b has achieved the lowest temperature at the time of sample heating among all the measuring points as described before, and now the selected temperature profile (profile A in FIG. 14) of the same measuring point 3b has satisfactorily met all the required conditions in the reflow stage. It may be assumed that profiles for rest of the measuring points 3a and 3c are all located above this profile A (upper side, i.e., at a side of higher temperature and longer heating time). Therefore, the heating condition of the heating sections VI and VII corresponding to the temperature profile A for the measuring point 3b may temporarily be determined as the appropriate heating condition at step #36 which may be considered to satisfy all the required conditions for heating the object.

Next, at step #37, based on the above temporarily determined heating condition, simulation is performed to develop temperature profiles for the rest of the measuring points, in an assumption that they are heated under the same heating condition. It is then confirmed based on the simulation results at step #38 whether or not the rest of the measuring points actually satisfy each of the required conditions of the reflow stage (confirmation step F). In this connection, the upper critical measuring point 3c which has achieved the highest temperature at sample heating timing is to be checked first, by confirming whether or not it can meet all the required conditions including the maximum temperature Tmax. If the upper critical measuring point 3c fails to meet the required conditions for heating, it can be judged instantly that such temporarily determined heating condition could not be a final solution even without confirming whether the rest of the measuring points satisfy the required conditions or not.

If it is confirmed that the upper critical measuring point 3c could satisfy all the required conditions through simulation, it may be considered that temperature profiles for the rest of the measuring points (only 3a, in this example) are located (i.e., sandwiched) between the lower and the upper critical measuring points 3b and 3c. Therefore it may be judged that the temporarily determined heating condition at step #36 may satisfy all the required conditions for heating at all the measuring points. Nevertheless, it may be desirable to perform simulation and to confirm whether or not the rest of the measuring points also satisfy the required conditions for heating, just in case.

If any one of the measuring points fails to meet the required conditions through simulation at step #38, another adjustment of the heating condition is required. In this case, the reason not to meet the required conditions is apparently over heated, because it was already known that the lower critical measuring point 3b with the lowest temperature could have met the required conditions. Therefore, the heating condition is modified by shortening the heating time (or increasing transfer speed) based on a predetermined rule at step #35, and then the process goes back to step #25 to repeat the procedures described above.

When modifying the heating condition by shortening the heating time at step #35, one possible example of the predetermined rule is to multiply preceding transfer speed with a ratio closest to 1 among ratios either of the targeted heat time t2 versus corresponding simulation result t (t/t2, >1), or of the allowable limited time t1 versus corresponding simulation result t (t/t1, >1), or among both of these ratios. It is also possible to divide the preceding heating time by the same ratio.

Through all the steps described above, when it is confirmed that all the required conditions are met at step #38, such temporarily determined heating condition may finally be determined as the appropriate heating condition at step #39. If the object is heated under such finally determined heating condition, it is assumed at least through simulation procedures that required conditions at both first and second heating stages are satisfied for all the measuring points. Although not shown in the flow chart of FIG. 11, it is also possible to verify whether or not such finally determined heating condition actually satisfy all the required conditions by heating a sample object under the same heating condition and measuring temperatures and times at all the measuring points to obtain actual temperature profiles.

In FIG. 11, when heating condition fails to meet the required conditions at any of the confirmation steps A-F and the heating condition is modified, the process should pass through a corresponding counting step #50 as shown in the drawing. Whenever the process goes through any one of step #50, such passage time n is counted. It may happen some time that the adjustment is repeatedly required and the process goes into a closed loop. In such a case, repeated passage time n in the closed loop is counted, and if the time n goes over a predetermined threshold number, it may be judged at step #51 that determining an appropriate heating condition to meet the required conditions is impossible. This is an optional procedure for finding a conclusion in a shorter period of time when determining appropriate heating condition deems impossible. In case of prior art where actual heating and measuring of a sample object are required, it is difficult to find a conclusion of an impossible case in such a short period of time. When outputting the conclusion at step #51, it may be desirable for further analysis to identify which conditions are not met by how much temperature and/or time discrepancies. According to the present embodiment, such data are easily available through the simulation as described above.

Even when an appropriate heating condition to satisfy all the required conditions is not determined, there should be a case where an approximate heating condition is needed in any event, which is in a condition almost satisfying the requirements. An algorithm for complying with such a need may be arranged as follows. FIGS. 15(a)-15(c) show repeated simulation results of the heating time t2 at the targeted heating temperature T2 (220° C.) and the heating time t1 at the allowable limited temperature T1 (200° C.) for each of the measuring points 3a-3c when the heating condition is modified. At FIG. 15(a), the time t1 of the upper critical measuring point 3c (42 seconds) fails to meet the required condition (less than 40 seconds), which may be found at step #38 (confirmation step F) of FIG. 11. Thus heating condition is modified at step #35 by shortening the heating time, and simulation is performed again.

FIG. 15(b) shows results of such a repeated simulation. Although the upper critical measuring point 3c could meet the required time (less than 40 seconds) by the above adjustment, the lower critical measuring point 3b (18 seconds) fails to meet the requited time (more than 20 seconds) this time, as shown within a circle. According to flow chart of FIG. 11, this is a failure at step #32 (confirmation step D), and the process should go to step #33 for modifying the heating conditions by lengthening heating time, and simulation should be repeated. According to such a procedure, however, it is apparent that if heating time is lengthened, the upper critical measuring point 3c would again fail to meet the required time t1 (less than 40 seconds), and therefore the same procedures are to be repeated within a closed loop.

Figure 16:
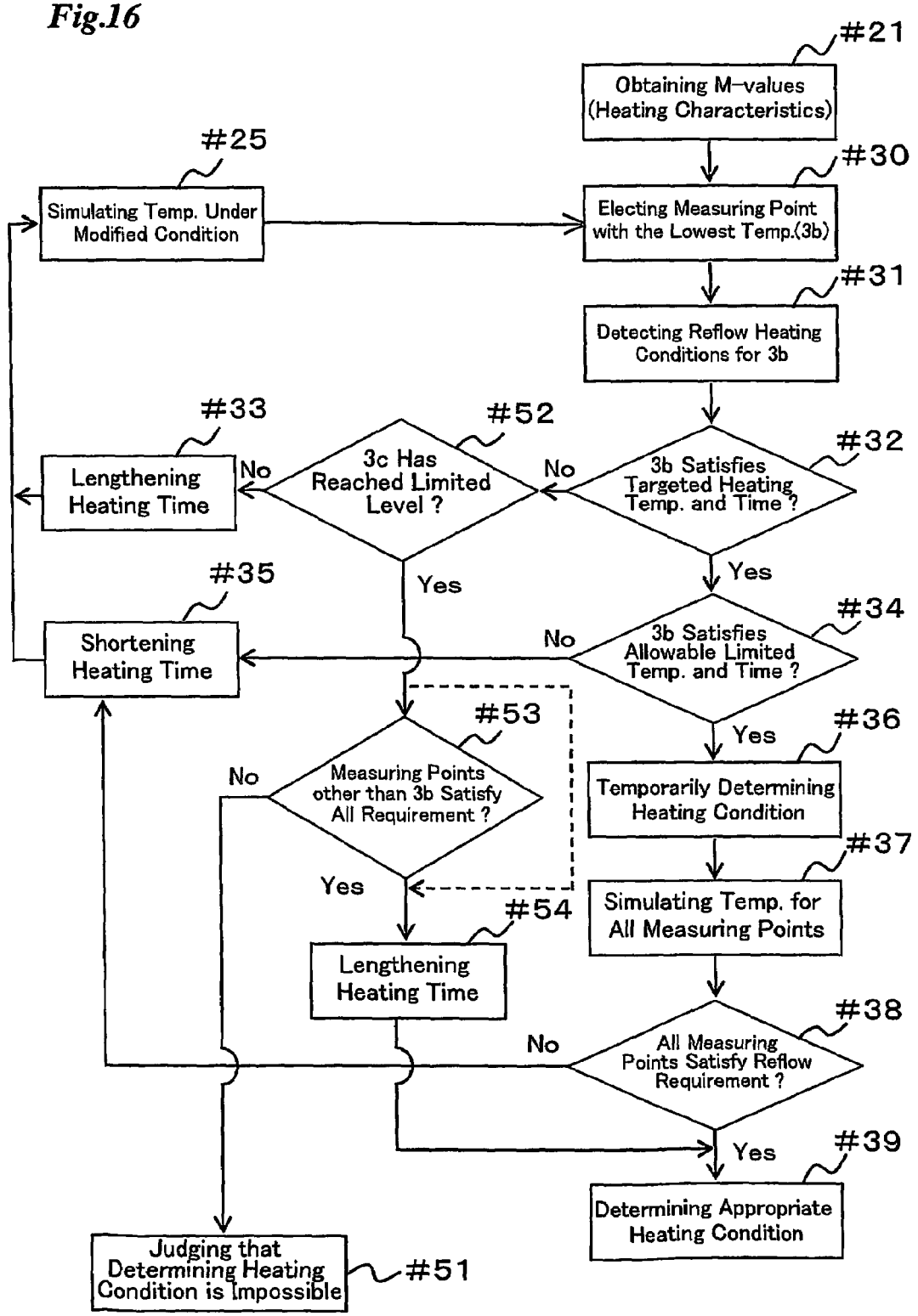
FIG. 16 shows an alternative flowchart of FIG. 11 to be applied to the second heating stage.

FIG. 16 shows a flow chart to determine an approximate solution for such a case. FIG. 16 shows only the second heating stage (reflow stage) for easier understanding, but it is, of course, also possible to add the first heating stage (preheat stage) to the flowchart, similar to the one shown in FIG. 11. In the flowchart shown in FIG. 16, steps #52-#54 are added to the second heating stage. In FIG. 16, if the situation turned into the case as shown in FIGS. 15(a) and 15(b), the process goes to step #52 after failure at step #32, and it is checked at step #52 whether the allowable limited time t1 (less than 40° C.) at temperature T1 (200° C.) for the upper critical measuring point 3c has already reached a limited level or not. The terms "limited level" means that the simulated time t has already reached the limited time t1 (40 seconds in this case), or even over the limited time t1. If the upper critical measuring point 3c already reached such a limited level, it is apparent that the upper critical measuring point 3c can not satisfy the required condition of t1 any longer, if the process goes to step #33 to lengthen the heating time. In this connection, if the process once went to step #38 where the upper critical measuring point 3c failed to meet the required time t1, and subsequent adjustment was made by shortening heating time at step #35 for repeating procedures through step #25, and yet the conditions at step #32 were not cleared, it is judged at step #52 that the upper critical measuring point 3c has already reached the point of such limited level.

In such a case, the process goes to step #53, and it is checked whether or not all the measuring points except the lower critical measuring point 3b have met all the required conditions. This step corresponds to a procedure at step #38. Since it is already known at this stage that the upper critical measuring point 3c is at the limited level, and the temperature profiles of the rest of the measuring points are assumed to be located (i.e., sandwiched) between the lower and the upper critical measuring points, step #53 may be skipped as shown by a dotted line in the drawing.

If the condition at step #53 is satisfied (i.e., "Yes" in the flowchart), the process goes to step #54 to modify the heating condition by lengthening heating time based on a predetermined rule in order to make the lower critical measuring point 3b to satisfy the targeted heating temperature t2. The heating conditions thus adjusted at step #54 may be deemed to be the appropriate heating conditions at step #39. FIG. 15(c) shows simulation results performed under the heating condition determined in this manner. Since the heating time is lengthened at step #54, the lower critical measuring point 3b could meet the targeted heating time t2 (more than 20 seconds). Instead, the upper critical measuring point 3c fails to meet the allowable limited time t1 (less than 40 seconds) as shown within a circle. Especially for the case of reflow process, the main purpose for heating is to thoroughly melt the solder, hence first priority should be given to making all the measuring points to meet the targeted heating temperature T2 and corresponding heating time t2. If the main purpose is different, it is possible to use other algorithm in which the first priority may be given to the other conditions, such as to meet the allowable limited temperature T1 and time t1. One possible example of the predetermined rule at step #54 is to multiply preceding transfer speed with a ratio of the targeted heating time t2 versus corresponding time t of simulation results for the measuring point 3b (t/t2, <1), or to divide the preceding heating time by the same ratio.

If any of the other measuring points fail to meet the required conditions at step #53, judgment should be made at last at step #51 that determining an appropriate heating conditions is deemed impossible. This judgment, however, should depend on the purpose of the heating. If any approximate heating conditions are needed at any event, step #53 may be skipped and the process goes to steps #54 and #39 to determine the approximate final solution.

The above description made by referring to FIG. 11 relates to a thermal analysis program which includes heating conditions of the first (preheat) and the second (reflow) heating stages. It is also possible to apply a similar program to the other types of heating processes. For example, if only one heating stage is arranged, the thermal analysis may be similarly performed by using either the first heating stage or the second heating stage shown in FIG. 11. If three or more heating stages are required, the thermal analysis may also be performed by selectively using the first or the second heating stage, or both of the heating stages in a repeated manner.

In the above description, when the heating condition fails to meet the required conditions at any confirmation steps A-F, all the procedures are repeated from the confirmation step A, which is the first confirmation step of the first (preheat) heating stage for all cases. If the heating condition, including the heating temperature and heating time (or transfer speed of the object) is controllable independently from each other among the first heating stage and the second heating stage, the process may not necessarily go back to the first confirmation step A, which is the very beginning of the heating process, all the time. Instead, if the heating condition failed to meet the required conditions of the second (reflow) stage at any of the confirmation steps D-F, modification of the heating condition may be made only for the second heating stage, and the process may go back to the confirmation step D (or step #30) to repeat the procedures for the second heating stage only, as shown by the dotted line in FIG. 11.

In the procedure described above, each of the required conditions for heating, such as the maximum temperature Tmax or allowable limited temperature T1 and time t1, is determined as a single figure (or a single condition) for the entire object to be heated, such as a circuit board. This means that such determined conditions are to be applied equally to all the electronic components mounted on the circuit board. Background for this is that if the most thermally critical electronic component among all the components to be mounted on the circuit board could meet the required conditions, the rest of the electronic components may more easily meet the same conditions. Alternatively, it is also possible to determine separate required conditions on a component by component basis, and such separate conditions may be used as auxiliary standards for determining appropriate heating condition. For example, even when a simulated temperature of one of the measuring points goes up to 245° C., for example, which is over the required conditions of maximum temperature Tmax of 240° C., such heating conditions may be acceptable as far as the separate required conditions for that particular electronic component permits temperature to go up to, for example, 250° C. It is especially beneficial to have such relieving logics for determining appropriate heating conditions in a thermally critical case where determination of heating condition seems difficult.

The above description is made on a basis of a reflow heating furnace in which lengthening/shorting of heating time and increasing/decreasing transfer speed may interchangeably be applied since the object to be heated is transferred inside the heating furnace. In case of a batch type of heating furnace which does not have any transfer device, adjusting heating time may only be applicable.

The recording medium described at the beginning of the present embodiment is a computer readable recording medium which may make the computer process the above-described procedures.

The third embodiment of the present invention will now be described hereinafter. The present embodiment relates to an apparatus for thermal analysis for performing an analysis as described in the first embodiment, a heat controller for controlling temperature of a heating furnace by utilizing the program or the recording medium as described in the second embodiment, and a heating furnace using such a heat controller. The heating furnace shown in FIG. 1 is one example of the present embodiment. Referring to FIG. 1, the heating furnace 10 has a plurality of heating sections I-VII, each of which has a heat source 7. Temperature of each heat source 7 may be independently controlled. The heating object 1 is introduced into the heating furnace 10 by transfer device 8, and then it is heated in accordance with a required temperature profile while it is transferred through the individual heating sections I-VII.

The heat controller 20 is connected to or integrally formed into the heating furnace 10, and designed to control heating temperature and/or transfer speed of the object at each of the heating sections I-VII independently. The heat controller 20 is capable of calculating m-values, or the heating characteristic values as described in the first embodiment, based on temperatures measured during heating of a sample object 1. Furthermore, the heat controller 20 is capable of determining a heating condition which may satisfy corresponding required conditions, and is capable of controlling the heating furnace 10 in accordance with the predetermined required conditions for heating. In this connection, the heat controller 20 may use the recording medium 30 recording the program described in the second embodiment.

Figure 17:
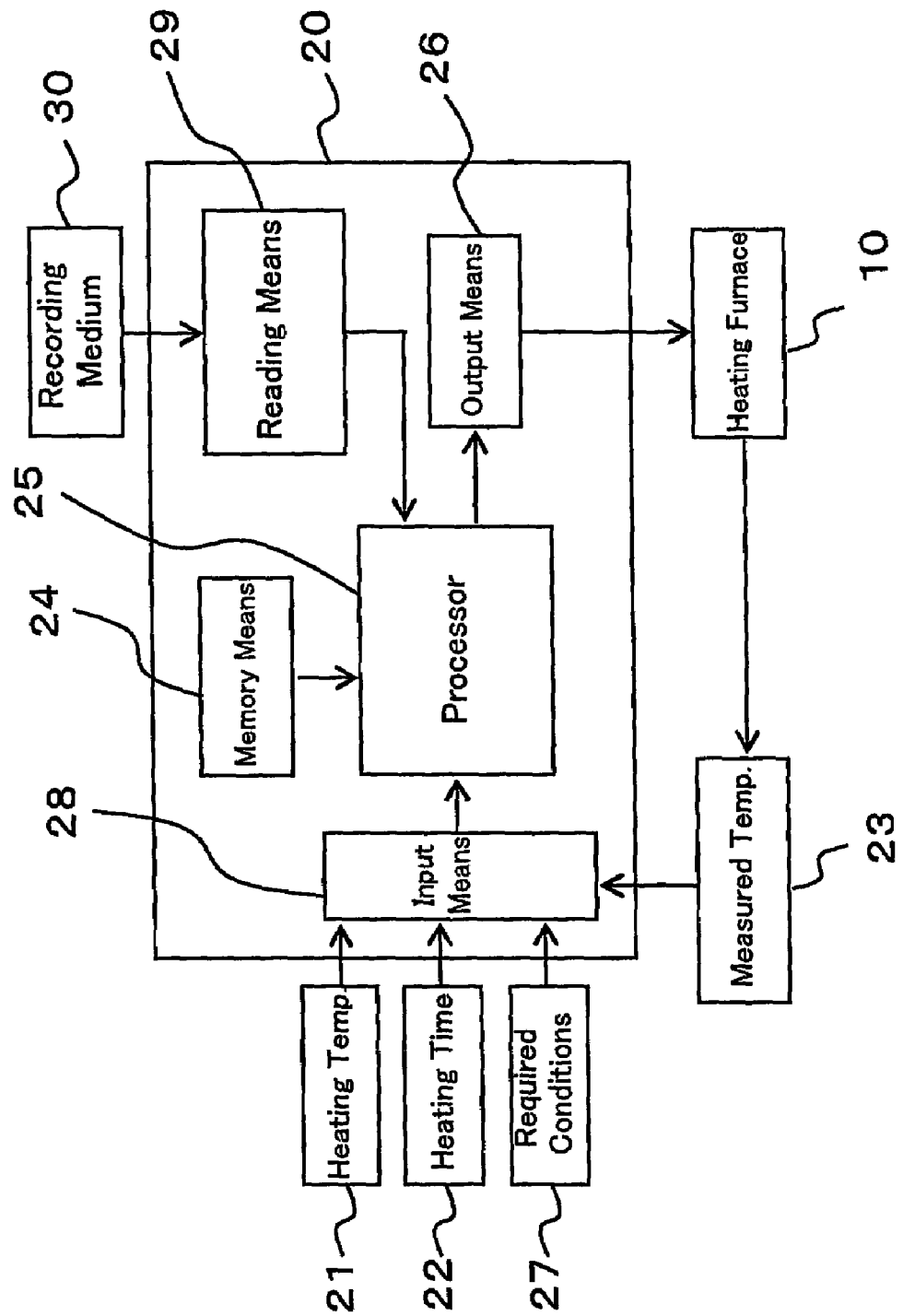
FIG. 17 illustrates a block diagram of a heating furnace and an apparatus for thermal analysis according to yet another embodiment of the present invention.

FIG. 17 schematically shows a block diagram of the heat controller 20 according to the present embodiment. The heat controller 20 has an input means 28, through which the heating condition including heating temperature 21 and heating time 22, as well as the required conditions 27 for heating the object may be inputted. Separately, measured temperatures 23 obtained by heating the sample object 1 in the heating furnace 10 may be inputted for calculating the heating characteristic values (m-values). The heat controller 20 also has a memory 24 where the basic equation for heating (Equation 7) used for calculating temperatures of the object, and a equation for calculating m-values (equation 8) are stored. The processing means 25 may calculate m-values by using such inputted information, and may perform simulation by using the m-values based on modified heating condition. The heat controller 20 also has a reading means 29 for reading the recording medium 30 so as to use the algorithm recorded in the medium 30. Through these means, the heat controller 20 may determine a heating condition appropriate for heating the object in accordance with the required conditions based on the simulation results. These outcomes are outputted through the output means 26, and the heating furnace 10 is controlled based on the outcome. The recording medium 30 described in the second embodiment may be used for such purposes.

The heat controller 20 shown in FIG. 17 has a function to control the heating furnace 10 through the output means 26. The heat controller 20 may also be used as an apparatus of thermal analysis for performing a simulation to identify temperatures of the heating object when it is heated under the inputted heating condition by using the calculated m-values. Furthermore, the heat controller 20 may also be used as an apparatus of thermal analysis for performing temperature simulation in accordance with a predetermined algorithm, if necessary, by including the reading means 29 for reading the recording media as described in the second embodiment.

As described before, the reflow furnace shown in FIG. 1 illustrates only an example of the present embodiment, and the present embodiment may also be applicable to a heating furnace without having a transfer device. In other words, the present embodiment may be applied to a variety of heating equipments having temperature administering and controlling functions, such as a heat treatment furnace for metallic materials, sintering a furnace for powder metallurgy, a baking oven such as used for ceramic materials, a melting furnace for melting a variety of materials, or incinerating equipment for burning wasted material in accordance with respective desired temperature profiles.

Furthermore, as described before, the term "heat" in this description may have a wider meaning including minus-heating, thus the heating furnace of the present invention may include equipments for cooling, such as a refrigerator, a freezer, a cooler etc. The method for performing heating simulation by using m-values of the present invention may also be applicable in a completely similar manner to the case of cooling as a method for performing cooling simulation.

The detailed description and specific examples by referring to several embodiments are given by way of illustrative purpose only, and it should be noted that various changes and modifications within the spirit and scope of the invention will become apparent to these skilled in the art from this detailed description.

The invention claimed is:

1. A method of thermal analysis for determining an appropriate heating condition for heating an object introduced into and heated in a heating furnace in accordance with a required temperature profile, wherein said method comprises:
    measuring a temperature at a measuring point of the object heated at each of a plurality of measuring locations of the heating furnace during a heating procedure for increasing the temperature of the object after introduction of the object into the heating furnace;
    determining a heating characteristic at each of the measuring locations by using a heating temperature at the measuring location and the temperature measured at the measuring point of the object, the measuring location being a location through which the object passes along a transferring direction in the heating furnace; and
    simulating a temperature profile of the object when a heating condition is changed by using the heating characteristic that is determined at each of the measuring locations,
    wherein the heating characteristic at each of the measuring locations is an m-value defined by:

$$m = \frac{1}{t} \ln\left[\frac{Ta - Tint}{Ta - Ts}\right]$$

wherein ln is natural logarithm, Ta is heating temperature at the measuring location of the heating furnace, Tint is initial temperature at the measuring point of the object at the measuring location, Ts is achieved temperature when the object is heated at the measuring location, and t is heating time at the measuring location.

2. A method according to claim 1, wherein the temperature Ts of the object is determined when the heating temperature Ta and the heating time t of the heating furnace are given, or the heating temperature Ta and the heating time t are determined when a required temperature Ts is given by using said m-values based on a following equation for heating:

$$Ts = Ta - (Ta - Tint)e^{-m \cdot t}$$

wherein e in the equation represents the base of natural logarithms.

3. A method according to claim 1, wherein said m-value is adjusted based on a predetermined equation of relationship between a blowing speed of heated air of the heating furnace and the m-value when the blowing speed of the heated air of the heating furnace is changed.

4. A method of thermal analysis according to claim 1, wherein the method further comprises:
    making a judgment as to whether or not the simulated temperature profile of the object when the heating condition is changed satisfies a required temperature profile; and
    determining the heating condition that satisfies the required temperature profile based on the judgment.

* * * * *